(12) United States Patent
Sakurada et al.

(10) Patent No.: US 10,533,265 B2
(45) Date of Patent: Jan. 14, 2020

(54) GROWTH CONTAINER

(71) Applicant: SUMITOMO ELECTRIC INDUSTRIES, LTD., Osaka-shi, Osaka (JP)

(72) Inventors: Takashi Sakurada, Itami (JP); Tomohiro Kawase, Itami (JP); Yoshiaki Hagi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 48 days.

(21) Appl. No.: 15/703,342

(22) Filed: Sep. 13, 2017

(65) Prior Publication Data

US 2018/0010262 A1 Jan. 11, 2018

Related U.S. Application Data

(63) Continuation of application No. 13/636,477, filed as application No. PCT/JP2011/057665 on Mar. 28, 2011, now Pat. No. 9,797,068.

(30) Foreign Application Priority Data

Mar. 29, 2010 (JP) ................. 2010-075524

(51) Int. Cl.
*C30B 27/00* (2006.01)
*C30B 11/00* (2006.01)
*C30B 29/40* (2006.01)

(52) U.S. Cl.
CPC ............. *C30B 27/00* (2013.01); *C30B 11/00* (2013.01); *C30B 29/40* (2013.01)

(58) Field of Classification Search
CPC combination set(s) only.
See application file for complete search history.

(56) References Cited

U.S. PATENT DOCUMENTS

| | | |
|---|---|---|
| 5,584,929 A | 12/1996 | Kawase |
| 5,656,077 A | 8/1997 | Kawase |
| 5,830,269 A | 11/1998 | Kawase et al. |

FOREIGN PATENT DOCUMENTS

| | | |
|---|---|---|
| JP | H03-57079 A | 3/1991 |
| JP | H06-219900 A | 8/1994 |

(Continued)

OTHER PUBLICATIONS

Machine translation of JP2005-306629.*

(Continued)

*Primary Examiner* — Erin F Bergner
(74) *Attorney, Agent, or Firm* — Drinker Biddle & Reath LLP

(57) ABSTRACT

Relates to a method of producing a semiconductor crystal having generation of a defect suppressed in the semiconductor single crystal. The production method includes the steps of: forming a boron oxide film (31) on the inner wall of a growth container (10) having a bottom section and a body section continuous to the bottom section; bringing the boron oxide film (31) into contact with boron oxide melt containing silicon oxide to form a boron oxide film (32) containing silicon oxide on the inner wall of the growth container (10); forming raw material melt (34) above seed crystal (20) placed in and on the bottom section of the growth container (10); and solidifying the raw material melt (34) from the seed crystal (20) side to grow a semiconductor single crystal.

3 Claims, 11 Drawing Sheets

(56) References Cited

FOREIGN PATENT DOCUMENTS

| JP | H06-239686 A | 8/1994 |
| JP | H07-300385 A | 11/1995 |
| JP | H08-133882 A | 5/1996 |
| JP | H08-151290 A | 6/1996 |
| JP | H09-48691 A | 2/1997 |
| JP | H10-259100 A | 9/1998 |
| JP | 2005-306629 A | 11/2005 |

OTHER PUBLICATIONS

Machine translation of JP08-151290.*
M. Zha et al., "Full encapsulated CdZnTe crystals by the vertical Bridgman method", Journal of Crystal Growth, 2008, pp. 2072-2075, vol. 310.
Machine translation of JP2005-306629 obtained Dec. 17, 2015.
Machine translation of JP08-151290 obtained Dec. 17, 2015.

* cited by examiner

GROWTH CONTAINER

CROSS-REFERENCE TO RELATED APPLICATIONS

This application is a continuation application of U.S. patent application Ser. No. 13/636,477, filed Sep. 21, 2012, which is a § 371 of International Application No. PCT/JP2011/057665, filed Mar. 28, 2011, which claims the benefit of JP 2010-075524, filed Mar. 29, 2010, the contents of each of which is incorporated herein by reference.

TECHNICAL FIELD

The present invention relates to a method of producing a semiconductor single crystal. Particularly, the present invention relates to a method of producing a semiconductor single crystal having the generation of a defect in the semiconductor single crystal suppressed.

BACKGROUND ART

As a method of growing a semiconductor single crystal such as the III-V group compound semiconductor single crystal including GaAs, GaP, GaSb, InP, InAs, and InSb as well as the II-VI group compound semiconductor single crystal including CdTe, CdMnTe, CdZnTe, HgCdTe, ZnSe, ZnSSe and the like, various growing methods have been conventionally proposed.

Typical methods of growing a semiconductor single crystal include the Czochralski method, horizontal Bridgman method, as well as the vertical boat method such as the vertical Bridgman method (VB method) and vertical gradient freeze method (VGF method). Such methods of growing semiconductor single crystals include the steps of placing seed crystal and raw material melt in a crucible, and solidifying the raw material melt from the seed crystal side to grow a semiconductor single crystal.

In order to prevent the escape of the V group and VI group that are volatile components from the growing semiconductor single crystal in the aforementioned methods of producing a semiconductor single crystal, a sealant is generally employed. For a sealant, boron oxide ($B_2O_3$) is well known, as described in Patent Literature 1 (Japanese Patent Laying-Open No. 6-219900), for example. However, in the case where $B_2O_3$ is used as a sealant when a doped type semiconductor single crystal such as semiconductor single crystal including silicon (Si) as a dopant is to be grown, $B_2O_3$ will capture Si, leading to the disadvantage that the Si concentration in the semiconductor single crystal will not be uniform. Furthermore, the usage of $B_2O_3$ as a sealant has the tendency of generating scum such as of boron arsenic ($B_{13}As_2$) due to the reduction of $B_2O_3$ to Si. In this case, the generated scum will adhere to the growing semiconductor single crystal. As a result, the produced crystal had a defect such as twinning and polycrystallization.

In view of such defects, Patent Literature 2 (Japanese Patent Laying-Open No. 3-57079) and Patent Literature 3 (Japanese Patent Laying-Open No. 8-151290), for example, propose the approach of using $B_2O_3$ including silicon dioxide ($SiO_2$) (hereinafter, referred to as "$SiO_2$—$B_2O_3$") as the sealant. The usage of $SiO_2$—$B_2O_3$ as a sealant can suppress the capture of Si and generation of scum.

$SiO_2$—$B_2O_3$ is also known to effectively prevent the wetting between the crucible and the raw material melt by coating the inner surface of the crucible, in addition to its function as a sealant. By preventing the wetting between the crucible and the raw material melt, the defect such as twinning and polycrystallization can be prevented effectively. For example, Patent Literature 4 (Japanese Patent Laying-Open No. 8-133882) discloses the method of forming an $SiO_2$—$B_2O_3$ film on the inner wall of a crucible made of pyrolytic boron nitride (PBN) using the so-called sol-gel method.

CITATION LIST

Patent Literature

PTL 1: Japanese Patent Laying-Open No. 6-219900
PTL 2: Japanese Patent Laying-Open No. 3-57079
PTL 3: Japanese Patent Laying-Open No. 8-151290
PTL: 4 Japanese Patent Laying-Open No. 8-133882

SUMMARY OF INVENTION

Technical Problem

Due to the high viscosity of the $SiO_2$—$B_2O_3$ melt, it was difficult to form an even and thin $SiO_2$—$B_2O_3$ film in the crucible directly using the melt. In the case where an $SiO_2$—$B_2O_3$ film is formed by the sol-gel method, it was difficult to form an $SiO_2$—$B_2O_3$ film evenly due to the low wettability between the coating raw material and crucible. There was also the problem that the formed $SiO_2$—$B_2O_3$ film will readily peel off when the sol-gel method is employed due to the great film shrinkage during the formation of the $SiO_2$—$B_2O_3$ film. Thus, forming an $SiO_2$—$B_2O_3$ film evenly in a crucible has not yet been achieved. The problem of the generation of a defect in the semiconductor single crystal is not yet solved.

In view of the problems set forth above, an object of the present invention is to provide a method of producing a semiconductor single crystal having generation of a defect in the semiconductor single crystal suppressed.

Solution to Problem

The present invention is directed to a method of producing a semiconductor single crystal, comprising the steps of forming a boron oxide film on an inner wall of a growth container having a bottom section and a body section continuous to the bottom section, bringing the boron oxide film into contact with a boron oxide melt containing silicon oxide to form a boron oxide film containing silicon oxide on the inner wall of the growth container, arranging raw material melt above a seed crystal placed inside and at the bottom section of the growth container, and solidify the raw material melt from the seed crystal side to grow a semiconductor single crystal.

In the method of producing a semiconductor crystal set forth above, the step of forming a boron oxide film containing silicon oxide preferably includes the steps of arranging boron oxide melt containing silicon oxide in the growth container, and maintaining the state of the boron oxide melt containing silicon oxide in contact with the boron oxide film formed on the inner wall of the growth container for a predetermined time at a predetermined temperature.

In the method of producing a semiconductor crystal set forth above, the boron oxide melt containing silicon oxide is preferably arranged in the growth container by heating the growth container to melt solid boron oxide containing silicon oxide arranged in the growth container.

In the method of producing a semiconductor crystal set forth above, the silicon oxide in the solid boron oxide containing silicon oxide is preferably silicon dioxide.

In the method of producing a semiconductor crystal set forth above, the concentration of silicon dioxide in the solid boron oxide containing silicon oxide is preferably greater than or equal to 1 mol % and less than or equal to 12 mol %.

In the method of producing a semiconductor crystal set forth above, the growth container is preferably made of boron nitride, pyrolytic boron nitride, pyrolytic graphite, graphite, glassy carbon, silicon carbide, alumina, zirconia, silicon nitride, or quartz.

In the method of producing a semiconductor crystal set forth above, the seed crystal is preferably placed in the growth container prior to formation of the boron oxide film.

In the method of producing a semiconductor crystal set forth above, the seed crystal is preferably placed in the growth container having a boron oxide film formed, prior to the formation of a boron oxide film containing silicon oxide.

In the method of producing a semiconductor crystal set forth above, the step of forming a boron oxide film preferably includes the step of forming a film containing boron nitride on the inner wall of the growth container, and subjecting the film containing boron nitride to heat treatment under oxygen gas atmosphere or mixture gas atmosphere including oxygen gas to form a boron oxide film on the inner wall of the growth container.

In the method of producing a semiconductor crystal set forth above, the film containing boron nitride is preferably formed on the inner wall of the growth container by sputtering or vapor deposition.

In the method of producing a semiconductor crystal set forth above, the film containing boron nitride is preferably formed by spraying or applying a liquid that is a mixture of boron nitride powder and a solvent on the inner wall of the growth container.

In the method of producing a semiconductor crystal set forth above, the step of forming a boron oxide film preferably includes the step of forming a film containing boron oxide or boric acid on the inner wall of the growth container, and subjecting the film containing boron oxide or boric acid to heat treatment to form a boron oxide film on the inner wall of the growth container.

In the method of producing a semiconductor crystal set forth above, the film containing boron oxide or boric acid is preferably formed on the inner wall of the growth container by sputtering or vapor deposition.

In the method of producing a semiconductor crystal set forth above, the film containing boron oxide or boric acid is preferably formed by spraying or applying a liquid that is a mixture of boron oxide powder or boric acid powder and a solvent on the inner wall of the growth container.

In the method of producing a semiconductor crystal set forth above, the growth container is made of boron nitride or pyrolytic boron nitride, and the step of forming a boron oxide film preferably includes the step of subjecting the inner wall of the growth container to oxidation to form the boron oxide film on the inner wall of the growth container.

In the method of producing a semiconductor crystal set forth above, the raw material melt is preferably arranged above the seed crystal by the melting of solid raw material, and the solid raw material preferably includes a compound semiconductor constituting the semiconductor single crystal and a dopant doped to the semiconductor single crystal.

In the method of producing a semiconductor crystal set forth above, the predetermined temperature is preferably greater than or equal to 600° C., and lower than the melting point of the semiconductor constituting the semiconductor crystal.

In the method of producing a semiconductor crystal set forth above, the predetermined time is preferably longer than or equal to 1 hour.

Advantageous Effects of Invention

According to the present invention, there can be provided a method of producing a semiconductor single crystal having generation of a defect suppressed in the semiconductor single crystal.

DESCRIPTION OF EMBODIMENTS

Figure 1:
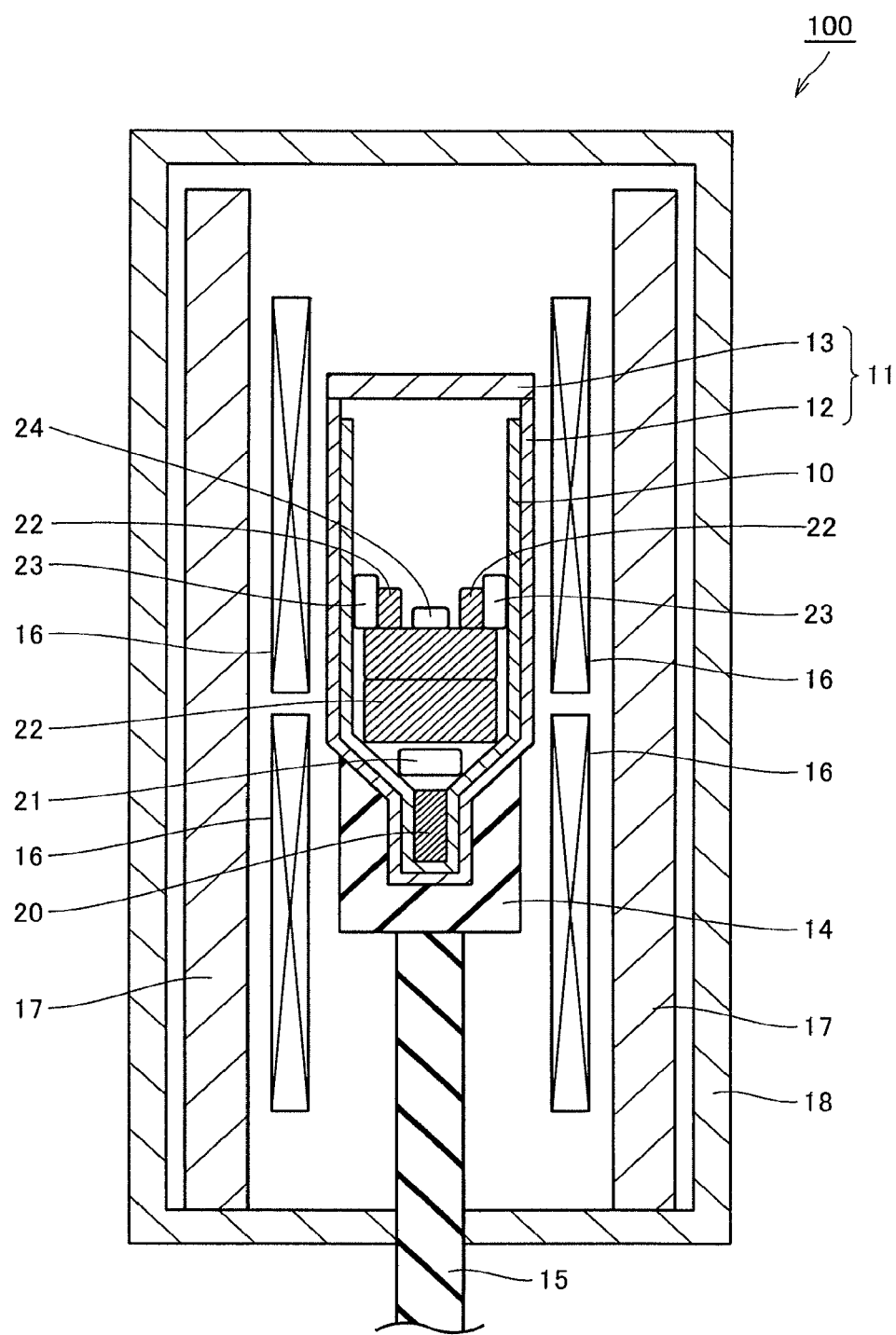
FIG. 1 is a schematic sectional view of a production equipment employed in a first embodiment.

Embodiments of the present invention will be described in detail with reference to the drawings. In the embodiments set forth below, the same or corresponding elements have the same reference characters allotted, and description thereof will not be repeated.

First Embodiment

<<Configuration of Production Equipment>>

FIG. 1 is a schematic sectional view of a production equipment employed in the first embodiment. First, a configuration of a production equipment employed in the present embodiment will be described based on FIG. 1.

Referring to FIG. 1, a semiconductor single crystal production equipment 100 includes a vertical-type crucible 10 qualified as a growth container, an ampoule 11, a crucible mount 14, a shaft 15, a heater 16, a heat insulator 17, and an airtight chamber 18.

Crucible 10 includes a bottom section where seed crystal 20 is placed, and a body section continuous to the bottom section and having a diameter larger than the leading end. The bottom section constitutes a closed end of crucible 10. The body section constitutes a side face of crucible 10, and an opening end of crucible 10. For the material of crucible 10, boron nitride (BN), pyrolytic boron nitride (PBN), pyrolytic graphite, graphite, glassy carbon, silicon carbide, alumina, zirconia, silicon nitride, or quartz can be cited.

At the region of the body section in proximity to the bottom section where seed crystal 20 is placed in crucible 10, solid boron oxide 21 is arranged. Above boron oxide 21, compound raw material 22 that is solid raw material and dopant 24 are arranged. Further, boron oxide containing silicon oxide 23 (hereinafter, referred to as "silicon oxide-boron oxide") is arranged above compound raw material 22.

The arrangement of boron oxide 21, compound raw material 22, silicon oxide-boron oxide 23 and dopant 24 is not limited to that shown in FIG. 1. Any arrangement is allowed as long as boron oxide 21 and silicon oxide-boron oxide 23 can be set at least under different temperature conditions in crucible 10. In the case where compound raw material 22 is arranged between silicon oxide-boron oxide 23 and dopant 24, as shown in FIG. 1, compound raw material 22 arranged therebetween serves to prevent dopant 24 from being brought into contact with the melt of silicon oxide-boron oxide 23 since the melting point of compound raw material 22 is higher than the melting point of silicon oxide-boron oxide 23. Accordingly, unnecessary reaction of the melt of silicon oxide-boron oxide 23 can be prevented.

For compound raw material 22, the III-V group compound material such as GaAs, InAs, InP, GaP, GaSb and InSb, and the II-VI group compound material such as CdTe and ZnSe can be cited. For example, polycrystalline based on these raw materials can be used. For dopant 24, Si, Te or the like can be cited.

Silicon oxide-boron oxide 23 is based on a composition having boron oxide doped with silicon oxide. As a method of producing silicon oxide-boron oxide 23, the coexistence of boric acid ($H_3BO_3$) powder and silicon dioxide ($SiO_2$) powder is heated to produce $SiO_2$-doped boron oxide. As another method, the coexistence of $B_2O_3$ powder or solid and $SiO_2$ powder or solid is heated to produce $SiO_2$-doped boron oxide.

Crucible 10 in which the materials set forth above are arranged is accommodated in a receptacle 12 of an ampoule 11 with the opening end constituting the body section oriented upwards. Ampoule 11 can seal crucible 10 by placing a lid 13 on the opening end of receptacle 12 in which crucible 10 is located.

Ampoule 11 in which crucible 10 is accommodated is mounted on a crucible mount 14. Crucible mount 14 is supported by shaft 15. Shaft 15 is movable up and down in the vertical direction in the drawing by driving means not shown. Shaft 15 may be rotatable with the vertical direction in the drawing as the center axis.

Ampoule 11 is surrounded by heater 16. Heater 16 can apply a temperature gradient in the vertical direction in the drawing to ampoule 11 under control of control means not shown. Since ampoule 11 is supported by shaft 15 that can move up and down in the vertical direction in the drawing, the temperature gradient to ampoule 11, i.e. the temperature gradient in crucible 10, can be varied in accordance with the up/down movement of shaft 15.

Heater 16 is surrounded by heat insulator 17. Ampoule 11, heater 16, and heat insulator 17 are stored in airtight chamber 18. Airtight chamber 18 can keep its interior airtight. Airtight chamber 18 may include a pressure adjuster to adjust the pressure inside.

<<Method of Producing Semiconductor Single Crystal>>

Figure 2:
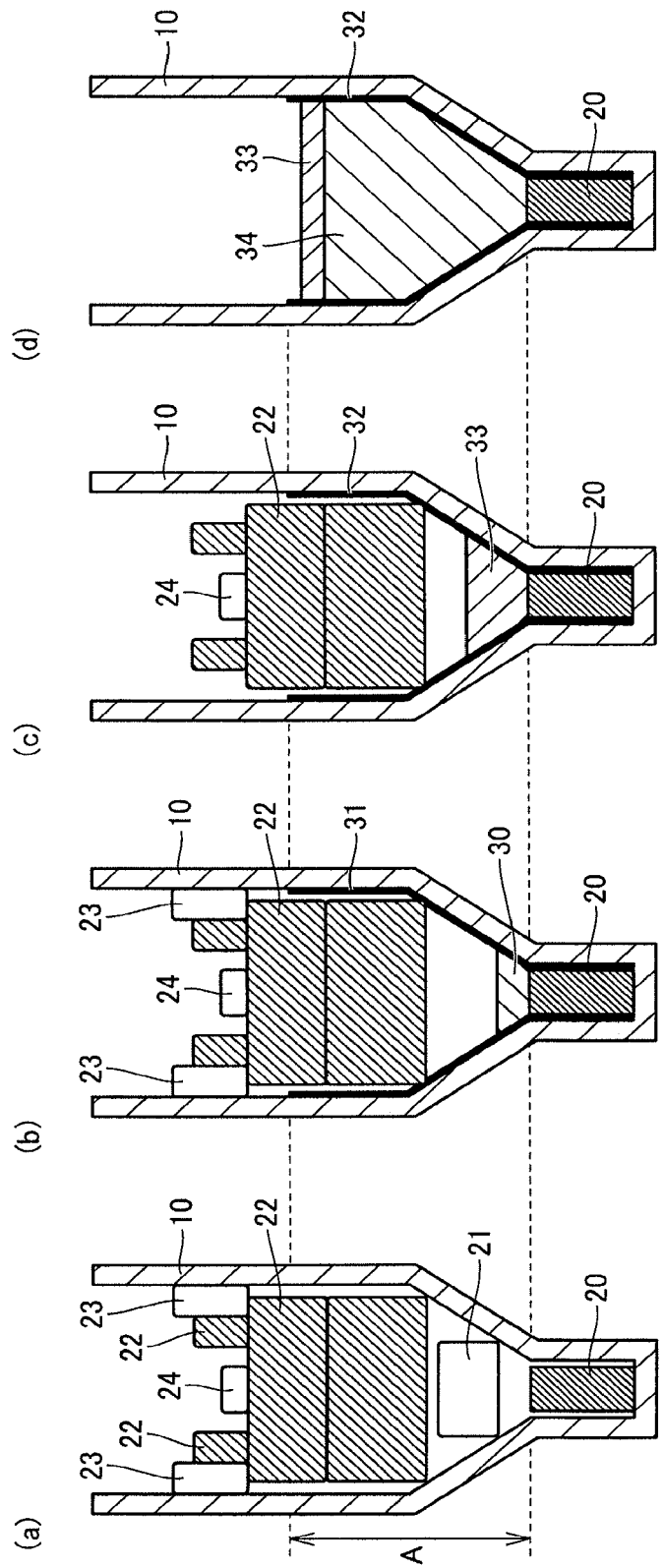
FIG. 2 represents a state in a growth container at each step in a production method according to the first embodiment.

A method of producing a semiconductor single crystal according to the present embodiment will be described hereinafter with reference to FIGS. 1 and 2. FIG. 2 represents the state inside the growth container at each step in the production method according to the first embodiment.

1. Boron Oxide Film Formation Step

First, at a boron oxide film formation step, a boron oxide film 31 is formed on the inner wall of crucible 10 having a bottom section and a body continuous to the bottom section.

In the present step, as shown in FIG. 2 (*a*), seed crystal 20 is placed at the bottom section in crucible 10, prior to formation of a boron oxide film. At the region of the body section continuous to the bottom section, in the neighborhood above seed crystal 20, solid boron oxide 21 is placed. Compound raw material 22 taking the shape of a cylindrical solid is located in the neighborhood above boron oxide 21. Furthermore, solid dopant 24 is arranged around the center above cylindrical compound raw material 22. Compound raw material 22 of arbitrary shape is arranged so as to surround dopant 24. Moreover, solid silicon oxide-boron oxide 23 is arranged above cylindrical compound raw material 22, in a state separated from dopant 24 via solid compound raw material 22 of arbitrary shape.

The arrangement of boron oxide 21, compound raw material 22, silicon oxide-boron oxide 23 and dopant 24 is not limited to that shown in FIG. 1. Any arrangement is allowed as long as boron oxide 21 and silicon oxide-boron oxide 23 can be set at least under different temperature conditions in crucible 10. Furthermore, the shape of compound raw material 22 is not limited to that set forth above.

Heater 16 heats crucible 10 having respective materials arranged such that a region A in FIG. 2 (*a*) attains a temperature greater than or equal to the melting point of boron oxide 21 and lower than the melting point of compound raw material 22. The heating of region A at such a temperature causes boron oxide 21 to melt. As a result, boron oxide melt 30 is located above seed crystal 20, as shown in FIG. 2 (*b*). By continuously maintaining region A at a temperature greater than or equal to the melting point of boron oxide 21 and lower than the melting point of compound raw material 22, a boron oxide film 31 is formed on the inner wall of crucible 10 at region A. Region A is where a semiconductor single crystal that will be described afterwards is grown, and is modified appropriately depending upon the size of the semiconductor single crystal to be produced.

By heating region A at a high temperature in the present step, a boron oxide film 31 can be formed quickly. Therefore, although it is preferable to set region A at a temperature as high as possible, a temperature greater than or equal to the melting point of compound raw material 22 at region A will cause not only boron oxide 21, but also compound raw material 22 to melt, rendering difficult an effective formation of boron oxide film 31. Therefore, it is preferable that heater 16 heats region A at a temperature as high as possible, but lower than the melting point of compound raw material 22 in the present step. Heater 16 preferably heats region A to at least a temperature greater than or equal to 600° C.

In the present step, region A is preferably maintained for one hour or more at a temperature greater than or equal to the melting point of boron oxide 21 and lower than the melting point of compound raw material 22. In the present step, crucible 10 may be rotated through rotation of shaft 15. Accordingly, boron oxide melt 30 can reliably reach as far as the upper end of region A evenly, allowing formation of an even boron oxide film 31.

A low impurity concentration and high purity of boron oxide 21 improves the coverage of boron oxide film 31 towards crucible 10. Therefore, boron oxide 21 preferably has no impurity included, and its purity is preferably greater than or equal to 99 atm %. In the case where the water content of boron oxide 21 is greater than or equal to 60 ppm, the coverage of boron oxide film 31 towards crucible 10 can be further improved. The water content of boron oxide 21 is preferably greater than or equal to 80 ppm, more preferably greater than or equal to 100 ppm.

2. Silicon Oxide-Boron Oxide Film Formation Step

As a silicon oxide-boron oxide film formation step, boron oxide film 31 is brought into contact with a boron oxide melt containing silicon oxide to form a silicon oxide-boron oxide film 32 on the inner wall of crucible 10.

In the present step, heater 16 heats crucible 10 such that the entirety of crucible 10 including region A of FIG. 2 (b) and the region where silicon oxide-boron oxide 23 is arranged attains a temperature greater than or equal to the melting point of silicon oxide-boron oxide 23 and lower than the melting point of compound raw material 22. The entirety of crucible 10 implies at least region A and the region where silicon oxide-boron oxide 23 is arranged. For example, in the case where crucible 10 is long and the body section of crucible 10 extends upper than the region where silicon oxide-boron oxide 23 is arranged, the extending region does not have to be included in the aforementioned entirety of crucible 10 region.

The heating of the entirety of crucible 10 at a temperature greater than or equal to the melting point of silicon oxide-boron oxide 23 and lower than the melting point of compound raw material 22 causes silicon oxide-boron oxide 23 to melt. The melt runs along the inner wall of crucible 10 to move towards the bottom section of crucible 10. The silicon oxide-boron oxide melt running over boron oxide film 31 adheres thereon, whereby a silicon oxide-boron oxide film is formed on boron oxide film 31. The remainder of the silicon oxide-boron oxide melt not adhering to boron oxide film 31 reaches the bottom section of crucible 10. As a result, silicon oxide-boron oxide melt 33 is arranged in crucible 10, as shown in FIG. 2 (c). This silicon oxide-boron oxide melt 33 is a mixture of boron oxide melt 30 and the silicon oxide-boron oxide melt generated by the melting of silicon oxide-boron oxide 23.

At this stage, as shown in FIG. 2 (b), silicon oxide-boron oxide 23 is preferably arranged at a position equal to or higher than the upper end of region A. In the case where silicon oxide-boron oxide 23 is arranged at such a position, the silicon oxide-boron oxide melt formed from silicon oxide-boron oxide 23 can run down evenly from the upper side towards the lower side over boron oxide film 31 at region A.

Then, by continuously maintaining the entirety of crucible 10 at a temperature greater than or equal to the melting point of silicon oxide-boron oxide 23 and lower than the melting point of compound raw material 22 for a predetermined time, the silicon oxide in the silicon oxide-boron oxide film formed on boron oxide film 31 will be diffused sufficiently into boron oxide film 31. As a result, an even silicon oxide-boron oxide film 32 is formed on the inner wall of crucible 10 at region A.

Formation of silicon oxide-boron oxide film 32 on the inner wall of crucible 10 can be confirmed by taking a sample of the material formed on the inner wall of crucible 10 and subjecting this sample to chemical analysis, for example. Furthermore, the evenness of silicon oxide-boron oxide film 32 can be confirmed by taking a sample from a plurality of sites on the inner wall of crucible 10, and subjecting the same to a similar analysis.

In the present step, silicon oxide can be made to diffuse evenly and effectively in boron oxide film 31 by maintaining the entirety of crucible 10 at a temperature greater than or equal to the melting point of silicon oxide-boron oxide 23 and lower than the melting point of compound raw material 22 for a predetermined time, for example, at least one hour, more preferably for at least three hours. Although the viscosity of boron oxide melt containing silicon oxide is high so that it is difficult to evenly form a film thereof in crucible 10, the present step eventually allows formation of an even silicon oxide-boron oxide film 32 due to the diffusion of silicon oxide into boron oxide film 31.

In the present step, the heating of region A at a high temperature allows rapid diffusion of silicon oxide into boron oxide film 31. Although it is preferable to subject region A to a temperature as high as possible, a temperature higher than the melting point of compound raw material 22 at region A will cause not only silicon oxide-boron oxide 23, but also compound raw material 22 to melt. This will render difficult an effective formation of a silicon oxide-boron oxide film 32. Therefore, in the present step, heater 16 heats region A preferably at a temperature as high as possible, but lower than the melting point of compound raw material 22. Heater 16 preferably heats region A to at least a temperature greater than or equal to 600° C.

In the present step, silicon oxide contained in silicon oxide-boron oxide 23 is preferably $SiO_2$. In this case, an $SiO_2$—$B_2O_3$ film can be formed on the inner wall of crucible 10 more effectively. The concentration of $SiO_2$ contained in silicon oxide-boron oxide 23 is preferably greater than or equal to 1 mol % from the standpoint of sufficiently diffusing $SiO_2$, and preferably less than or equal to 12 mol % from the standpoint of adjusting the viscosity of the silicon oxide-boron oxide melt to facilitate sufficient running over boron oxide film 31.

In the case where dopant 24 and silicon oxide-boron oxide 23 are arranged separately with compound raw material 22 therebetween in the present step, as shown in FIG. 2, the contact between dopant 24 and the melt of silicon oxide-boron oxide 23 can be prevented. Accordingly, unnecessarily reaction of the melt of silicon oxide-boron oxide 23 can be prevented.

In the present step, crucible 10 may be rotated by the rotation of shaft 15. The rotation of crucible 10 allows the silicon oxide-boron oxide melt obtained from silicon oxide-boron oxide 23 to run from the upper side towards the lower side while spreading evenly over boron oxide film 31 on the inner wall of crucible 10. Furthermore, since boron oxide film 31 and silicon oxide-boron oxide melt can be brought into contact effectively, a silicon oxide-boron oxide film can be formed evenly. This facilitates diffusion of silicon oxide present in the silicon oxide-boron oxide film into the boron oxide film. As a result, an even silicon oxide-boron oxide film 32 is formed on the inner wall of crucible 10 at region A.

3. Raw Material Melt Formation Step

As a raw material melt formation step, raw material melt is arranged above seed crystal 20 placed at the bottom section of crucible 10.

In the present step, heater 16 heats crucible 10 such that the entirety of crucible 10 including region A of FIG. 2 (c) and the region where compound raw material 22 and dopant 24 are arranged attains a temperature greater than or equal to the melting point of compound raw material 22. Such heating of crucible 10 at this temperature causes compound raw material 22 to melt. Thus, raw material melt 34 including dopant 24 is arranged above seed crystal 20, as shown in FIG. 2 (d).

In the present step, the liquid level of raw material melt 34 rises from the lower side towards the upper side in crucible 10 as the volume of raw material melt 34 (generated amount) increases. In response to the rise of the liquid level, silicon oxide-boron oxide melt 33 elevates from the position of FIG. 2 (c) to the position of FIG. 2 (d). The rise of silicon oxide-boron oxide melt 33 from the lower side towards the upper side in the crucible ensures that the inner surface of crucible 10 is covered with silicon oxide-boron oxide melt 33. Raw material melt 34 corresponds to the compound raw material melt produced by the melting of compound raw material 22, having dopant 24 dissolved therein. Silicon oxide-boron oxide melt 33 functions as a sealant of raw material melt 34.

4. Semiconductor Single Crystal Growth Step

Next, as a semiconductor single crystal growth step, a semiconductor single crystal is grown by solidifying raw material melt 34 from the side of seed crystal 20.

In the present step, crucible 10 moves downwards in FIG. 1, relative to the temperature gradient applied in the vertical direction of crucible 10 by heater 16, according to the well-known method of growing a semiconductor single crystal. Accordingly, raw material melt 34 is solidified starting from the side of seed crystal 20, causing the growth of a compound semiconductor single crystal including the dopant.

By the boron oxide film formation step and silicon oxide-boron oxide film formation step according to the present embodiment, silicon oxide-boron oxide film 32 can be formed evenly on the inner wall of crucible 10 at least at region A where a semiconductor single crystal is to be to grown. Accordingly, the wetting between the inner wall of crucible 10 and compound raw material 34 can be suppressed in the semiconductor single crystal growth step, and reaction between the dopant dissolved in the raw material melt and the boron oxide film on the inner wall of the crucible is impeded. Therefore, the generation of a defect such as twinning and polycrystallization can be suppressed. Therefore, the yield of producing semiconductor single crystals can be improved. Furthermore, the generation of scum such as of boron arsenic can be suppressed since silicon oxide-boron oxide melt 33 is employed as the sealant.

Second Embodiment

<<Configuration of Production Equipment>>

The configuration of a production equipment employed in the present embodiment is similar to that of the production equipment of FIG. 1. Therefore, description thereof will not be repeated.

<<Method of Producing Semiconductor Single Crystal>>

Figure 3:
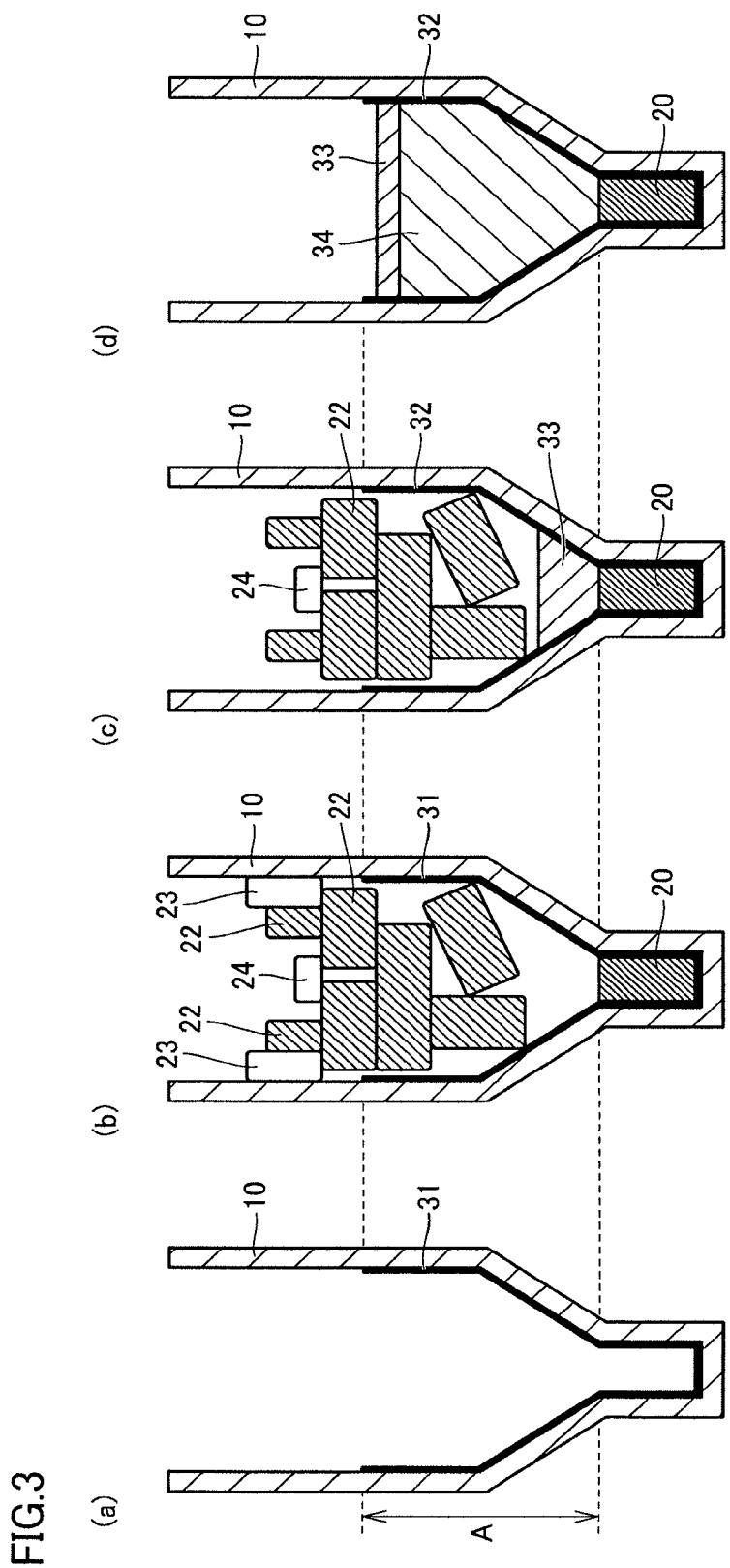
FIG. 3 represents a state in a growth container at each step in a production method according to a second embodiment.

A method of producing a semiconductor single crystal according to the present embodiment will be described with reference to FIGS. 1 and 3. FIG. 3 represents a state in the growth container at each step in a production method according to the second embodiment.

1. Boron Oxide Film Formation Step

First, as a boron oxide film formation step, a boron oxide film 31 is formed on the inner wall of crucible 10 having a bottom section and a body continuous to the bottom section.

In the present step, boron oxide film 31 is formed on the inner wall of an empty crucible 10 prior to arranging various substances such as seed crystal 20. Likewise with the first embodiment, the method of forming boron oxide film 31 may include the method of causing solid boron oxide to melt in crucible 10, followed by heating. In the case where crucible 10 is made of BN or PBN, boron oxide film 31 may be formed by heating crucible 10 under oxygen atmosphere for oxidation.

Alternatively, boron oxide film 31 may be formed by forming a film containing boron nitride through sputtering or vapor deposition on the inner wall of crucible 10, and subjecting the film containing boron nitride to heat treatment under oxygen gas atmosphere or mixture gas atmosphere including oxygen gas. Alternatively, boron oxide film 31 may be formed by the steps of mixing boron nitride powder with a solvent such as water, alcohol or acetone, spraying or applying the mixture liquid on or to the inner wall of crucible 10, and applying heat treatment to the film containing boron nitride under oxygen gas atmosphere or mixture gas atmosphere including oxygen gas.

Alternatively, a film containing boron oxide or boric acid is formed on the inner wall of crucible 10 by sputtering or vapor deposition, followed by heat treatment to form boron oxide film 31. Further alternatively, boron oxide film 31 may be formed by the steps of mixing boron oxide powder or boric acid powder with a solvent such as water, alcohol, acetone, or the like, spraying or applying the mixture liquid on or to the inner wall of crucible 10, and applying heat treatment.

2. Silicon Oxide-Boron Oxide Film Formation Step

As a silicon oxide-boron oxide film formation step, boron oxide film 31 is brought into contact with silicon oxide-boron oxide melt 33 to form a silicon oxide-boron oxide film 32 on the inner wall of crucible 10.

In the present step, seed crystal 20, compound raw material 22, silicon oxide-boron oxide 23 and dopant 24 are placed in crucible 10 having boron oxide film 31 formed. Although the arrangement of the substances is not particularly limited, silicon oxide-boron oxide 23 is preferably arranged at a position equal to or higher than the upper end of region A, as shown in FIG. 3 (b). In the case where silicon oxide-boron oxide 23 is arranged at such a position, the silicon oxide-boron oxide melt generated from silicon oxide-boron oxide 23 can run evenly over boron oxide film 31 at region A from the upper side towards the lower side. Furthermore, as shown in FIG. 3 (b), dopant 24 and silicon oxide-boron oxide 23 are preferably arranged apart from each other. Accordingly, unnecessary reaction of the melt of silicon oxide-boron oxide 23 can be prevented.

Then, heater 16 heats crucible 10 such that the entirety of crucible 10 including region A of FIG. 3 (b) and the region where silicon oxide-boron oxide 23 is arranged attains a temperature greater than or equal to the melting point of silicon oxide-boron oxide 23 and lower than the melting point of compound raw material 22. By heating crucible 10 at such a temperature, silicon oxide-boron oxide 23 melts. The melt runs along the inner wall of crucible 10 towards the bottom section of crucible 10. The silicon oxide-boron oxide melt running over boron oxide film 31 adheres thereto, whereby a silicon oxide-boron oxide film is formed on boron oxide film 31. Then, the remainder of silicon oxide-boron oxide melt not adhering to boron oxide film 31 arrives at the bottom section of crucible 10. Thus, silicon oxide-boron oxide melt 33 is arranged in crucible 10, as shown in FIG. 3 (c).

Then, by continuously maintaining the entirety of crucible 10 at a temperature greater than or equal to the melting point of silicon oxide-boron oxide 23 and lower than the melting point of compound raw material 22 for a predetermined time, silicon oxide present in the silicon oxide-boron oxide film formed on boron oxide film 31 diffuses sufficiently into boron oxide film 31. As a result, an even silicon oxide-boron oxide film 32 is formed on the inner wall of crucible 10 at region A.

By maintaining the entirety of crucible 10 at a temperature greater than or equal to the melting point of silicon oxide-boron oxide 23 and lower than the melting point of compound raw material 22 for a predetermined time, for example, at least one hour, more preferably for at least 3 hours, in the present step, silicon oxide can be made to diffuse evenly and effectively in boron oxide film 31. By heating region A at a high temperature, at least greater than or equal to 600° C., rapid diffusion of silicon oxide into boron oxide film 31 is allowed.

In the case where dopant 24 and silicon oxide-boron oxide 23 are arranged separately with compound raw material 22 therebetween as shown in FIG. 3 (*b*) in the present step, the contact between dopant 24 and the melt of silicon oxide-boron oxide 23 can be prevented. As a result, unnecessary reaction of the melt of silicon oxide-boron oxide 23 can be prevented.

In the present step, crucible 10 can be rotated by the rotation of shaft 15. The rotation of crucible 10 allows the silicon oxide-boron oxide melt generated from silicon oxide-boron oxide 23 to run from the upper side towards the lower side while spreading evenly over boron oxide film 31 on the inner wall of crucible 10. Furthermore, since the silicon oxide-boron oxide melt can be brought into contact effectively with boron oxide film 31, a silicon oxide-boron oxide film can be formed evenly. Accordingly, diffusion of silicon oxide present in the silicon oxide-boron oxide film into the boron oxide film is facilitated. As a result, an even silicon oxide-boron oxide film 32 can be formed on the inner wall of crucible 10 at region A.

3. Raw Material Melt Formation Step

The present step is similar to the raw material melt formation step of the first embodiment. Therefore, description thereof will not be repeated (refer to FIG. 3*d*).

4. Semiconductor Single Crystal Growth Step

The present step is similar to the semiconductor single crystal growth step of the first embodiment. Therefore, description thereof will not be repeated.

By the boron oxide film formation step and silicon oxide-boron oxide film formation step according to the present embodiment, silicon oxide-boron oxide film 32 can be formed evenly on the inner wall of crucible 10 at at least region A where a semiconductor single crystal is to be grown. Accordingly, the wetting between the inner wall of crucible 10 and compound raw material 34 can be suppressed in the semiconductor single crystal growth step, and reaction between the dopant dissolved in the raw material melt and the boron oxide film on the inner wall of the crucible is impeded. Therefore, the generation of a defect such as twinning and polycrystallization can be suppressed. Thus, the yield of producing semiconductor single crystals can be improved. Furthermore, the generation of scum such as of boron arsenic can be suppressed since silicon oxide-boron oxide melt 33 is employed as the sealant.

Third Embodiment

<<Configuration of Production Equipment>>

Figure 4:
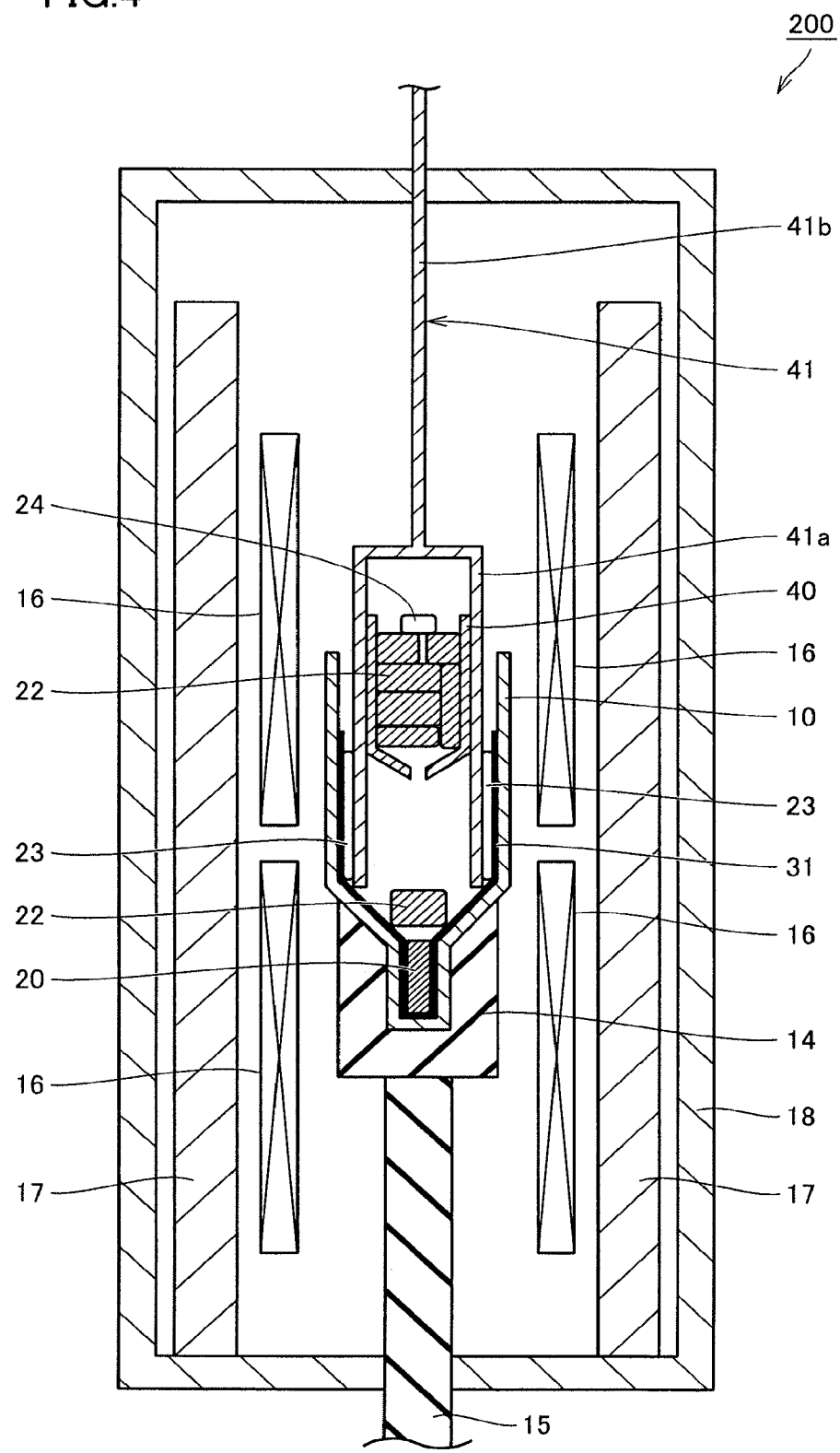
FIG. 4 is a schematic sectional view of a production equipment employed in a third embodiment.

FIG. 4 is a schematic sectional view of a production equipment employed in the third embodiment. A configuration of the production equipment employed in the present embodiment will be described with reference to FIG. 4. Only the configuration differing from that of the production equipment shown in FIG. 1 will be described.

Referring to FIG. 4, a production equipment 200 includes a reservoir 40 in which compound raw material 22 and dopant 24 are stored, and a support unit 41 for holding reservoir 40. Reservoir 40 has the upper portion and lower portion partially open, and accommodates compound raw material 22 and dopant 24. The arrangement of compound raw material 22 and dopant 24 is not limited to that shown in FIG. 4.

Support unit 41 includes an enclosure section 41*a* to encase reservoir 40, and a support section 41*b* coupled with enclosure section 41*a* to hang enclosure section 41*a* towards crucible 10 from above. Support unit 41 can move up and down in the vertical direction in the drawing by driving means. Solid silicon oxide-boron oxide 23 is arranged between the end side face of enclosure section 41*a* of support unit 41 and the inner wall of crucible 10. When production equipment 200 attains the state shown in FIG. 4, boron oxide film 31 is formed in advance on the inner wall of crucible 10, prior to producing a semiconductor single crystal.

<<Method of Producing Semiconductor Single Crystal>>

Figure 5:
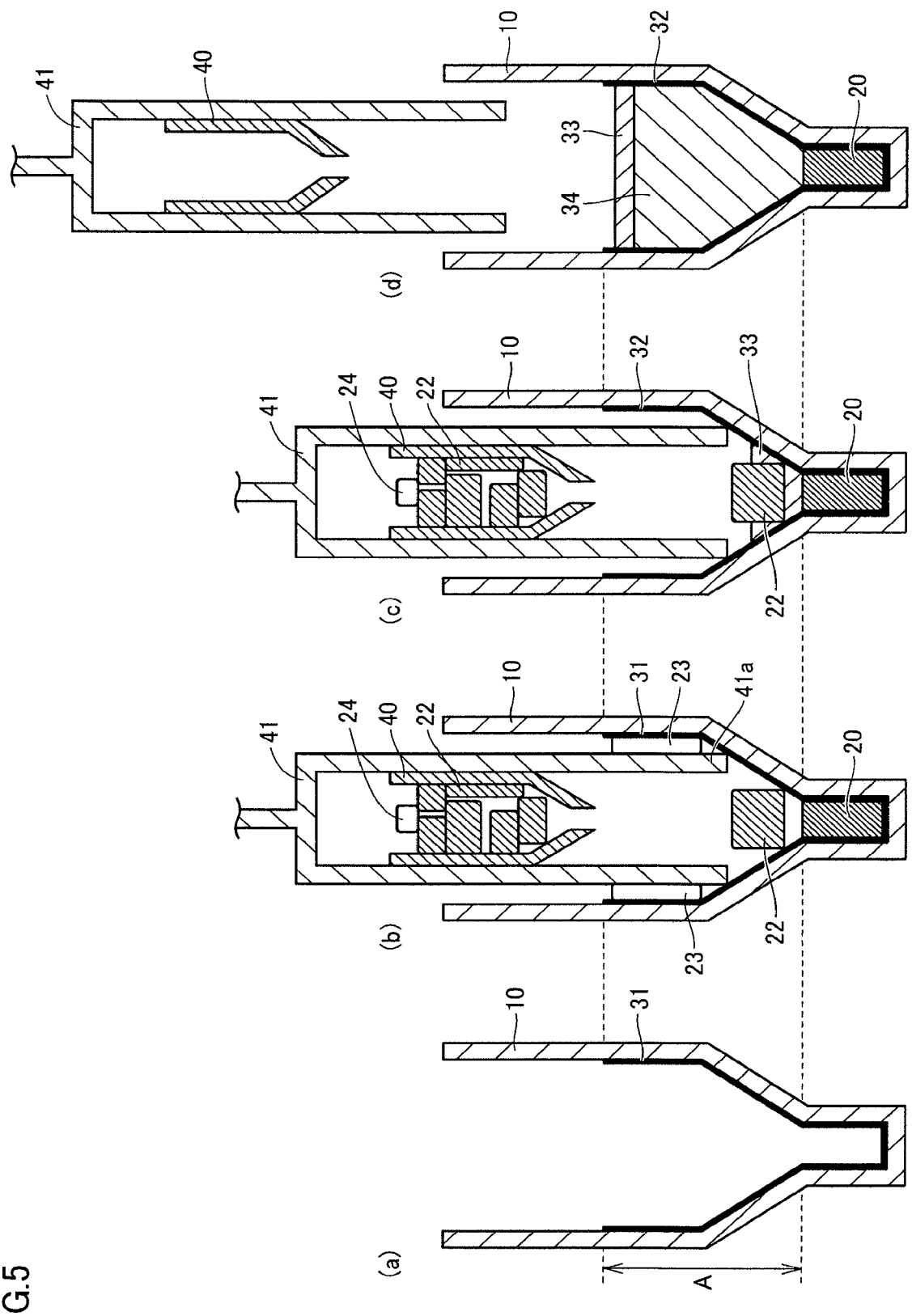
FIG. 5 represents a state in a growth container at each step in a production method according to the third embodiment.

A method of producing a semiconductor single crystal according to the present embodiment will be described with reference to FIGS. 4 and 5. FIG. 5 represents a state in the growth container at each step of the production method according to the third embodiment.

1. Boron Oxide Film Formation Step

The present step is similar to the boron oxide film formation step of the second embodiment. Therefore, description thereof will not be repeated.

2. Silicon Oxide-Boron Oxide Film Formation Step

As a silicon oxide-boron oxide film formation step, boron oxide film 31 shown in FIG. 5 (*a*) is brought into contact with silicon oxide-boron oxide melt 33, whereby a silicon oxide-boron oxide film 32 is formed on the inner wall of crucible 10.

In order to attain the state shown in FIG. 5 (*b*) in the present step, first seed crystal 20 is placed at the bottom section in crucible 10, and compound raw material 22 is arranged in the neighborhood thereabove. Then, reservoir 40 with compound raw material 22 and dopant 24 stored therein is encased in support unit 41. Support unit 41 is hung from above crucible 10 towards the inner side of crucible 10 such that the open end of enclosure section 41*a* of support unit 41 is introduced into crucible 10. Then, silicon oxide-boron oxide 23 is arranged in the gap between the end side face of enclosure section 41*a* and the inner wall of crucible 10 having boron oxide film 31 formed. Thus, respective materials and elements are arranged corresponding to the state shown in FIG. 5 (*b*).

Then, heater 16 heats crucible 10 such that at least region A where a semiconductor single crystal is to be grown attains a temperature greater than or equal to the melting point of silicon oxide-boron oxide 23 and lower than the melting point of compound raw material 22. Accordingly, silicon oxide-boron oxide 23 arranged in region A melts. The melt runs along the inner wall of crucible 10, downwards to the bottom section of crucible 10. The silicon oxide-boron oxide melt running over boron oxide film 31 adheres thereon, whereby a silicon oxide-boron oxide film is formed on boron oxide film 31. The remainder of silicon oxide-boron oxide melt not adhering on boron oxide film 31 reaches the bottom section of crucible 10. Thus, silicon oxide-boron oxide melt 33 is arranged in crucible 10, as shown in FIG. 5 (*c*).

By reducing the gap between the end side face of enclosure section 41*a* and the inner wall of crucible 10 having boron oxide film 31, the silicon oxide-boron oxide melt can be made to adhere evenly on boron oxide film 31 by effect of surface tension, allowing the formation of a more even silicon oxide-boron oxide film 32.

By continuously maintaining the entirety of crucible 10 at the temperature greater than or equal to silicon oxide-boron oxide 23 and lower than the melting point of compound raw material 22, silicon oxide present in the silicon oxide-boron oxide film formed on boron oxide film 31 diffuses sufficiently into boron oxide film 31. As a result, an even silicon oxide-boron oxide film 32 is formed on the inner wall of crucible 10 at region A.

By maintaining the entirety of crucible 10 at a temperature greater than or equal to the melting point of silicon oxide-boron oxide 23 and lower than the melting point of compound raw material 22 for a predetermined time, for example, at least one hour, more preferably for at least 3 hours, in the present step, silicon oxide can be made to diffuse evenly and effectively in boron oxide film 31. Further, by heating region A at a high temperature, at least greater than or equal to 600° C., rapid diffusion of silicon oxide into boron oxide film 31 is allowed.

In the case where dopant 24 is stored together with compound raw material 22 in reservoir 40 that is encased in support unit 41, as shown in FIG. 5 (b) in the present step, the contact between dopant 24 and the melt of silicon oxide-boron oxide 23 can be prevented. Accordingly, unnecessary reaction of the melt of silicon oxide-boron oxide 23 can be prevented.

In the present step, crucible 10 can be rotated by the rotation of shaft 15. The rotation of crucible 10 allows the silicon oxide-boron oxide melt generated from silicon oxide-boron oxide 23 to run from the upper side towards the lower side while spreading evenly over boron oxide film 31 on the inner wall of crucible 10. Furthermore, since the silicon oxide-boron oxide melt can be brought into contact effectively with boron oxide film 31, a silicon oxide-boron oxide film can be formed evenly. Accordingly, diffusion of silicon oxide present in the silicon oxide-boron oxide film into the boron oxide film is facilitated. As a result, an even silicon oxide-boron oxide film 32 can be formed on the inner wall of crucible 10 at region A.

3. Raw Material Melt Formation Step

For the raw material melt formation step, raw material melt is provided above seed crystal 20 located at the bottom section of crucible 10.

In the present step, heater 16 heats crucible 10 such that the entirety of crucible 10 including region A of FIG. 5 (c) and the region where compound raw material 22 and dopant 24 stored in reservoir 40 are located. In the case where compound raw material 22 and dopant 24 stored in reservoir 40 are located upper than crucible 10, heater 16 is to effect heating such that, not only the entirety of crucible 10, but also the entirety of reservoir 40, attains the same temperature. Heater 16 only needs to heat at least region A and the lower end at the site where compound raw material 22 stored in reservoir 40 is located.

The heating of crucible 10 by the temperature set forth above causes compound raw material 22 in crucible 10 and compound raw material 22 in reservoir 40 to melt, whereby the melt of compound raw material 22 and dopant 24 in reservoir 40 fall in droplets from the lower opening of reservoir 40 down on seed crystal 20 located below. At this stage, crucible 10 can be sealed by the arrangement of support unit 41 at the position shown in FIG. 5 (c). Therefore, the melt of compound raw material 22 can be prevented from volatilizing. Then, as shown in FIG. 5 (d), after the melt of compound raw material 22 and dopant 24 in reservoir 40 completely fall down in droplets into crucible 10, support unit 41 is pulled upwards in the drawing. Raw material melt 34 in FIG. 5 (d) corresponds to the compound raw material melt produced by the melting of compound raw material 22 with dopant 24 dissolved therein. The pull-up timing of reservoir 40 is not limited to that described above. For example, reservoir 40 may be gradually pulled up in accordance with the rise of the liquid level of raw material melt 34.

In the present step, the liquid level of raw material melt 34 rises from the lower side towards the upper side in crucible 10 as the volume of raw material melt 34 (generated amount) increases. In response to the rise of the liquid level, silicon oxide-boron oxide melt 33 elevates from the position of FIG. 5 (c) to the position of FIG. 5 (d). The rise of silicon oxide-boron oxide melt 33 from the lower side towards the upper side in the crucible further ensures that the inner surface of crucible 10 is covered with silicon oxide-boron oxide melt 33. Silicon oxide-boron oxide melt 33 functions as a sealant of raw material melt 34.

4. Semiconductor Single Crystal Growth Step

The present step is similar to the semiconductor single crystal growth step of the first embodiment. Therefore, description thereof will not be repeated.

By the boron oxide film formation step and silicon oxide-boron oxide film formation step according to the present embodiment, silicon oxide-boron oxide film 32 can be formed evenly on the inner wall of crucible 10 at at least region A where a semiconductor single crystal is to be to grown. Accordingly, the wetting between the inner wall of crucible 10 and compound raw material 34 can be suppressed in the semiconductor single crystal growth step, and reaction between the dopant dissolved in the raw material melt and the boron oxide film on the inner wall of the crucible is impeded. Therefore, the generation of a defect such as twinning and polycrystallization can be suppressed. Thus, the yield of producing semiconductor single crystals can be improved. Furthermore, the generation of scum such as of boron arsenic can be suppressed since silicon oxide-boron oxide melt 33 is employed as the sealant.

EXAMPLES

Example 1

Using production equipment 100 of FIG. 1, a GaAs single crystal containing Si as a dopant (hereinafter, referred to as "Si—GaAs single crystal") was produced by a production method set forth below. For crucible 10, a PBN-made crucible with an inner diameter of 105 mm (4 inches) was employed. For ampoule 11, a quartz-made ampoule was employed. For the sake of understanding, the present example will be described hereinafter with reference to FIG. 6.

<<Production Method>>

1. Boron Oxide Film Formation Step

Figure 6:
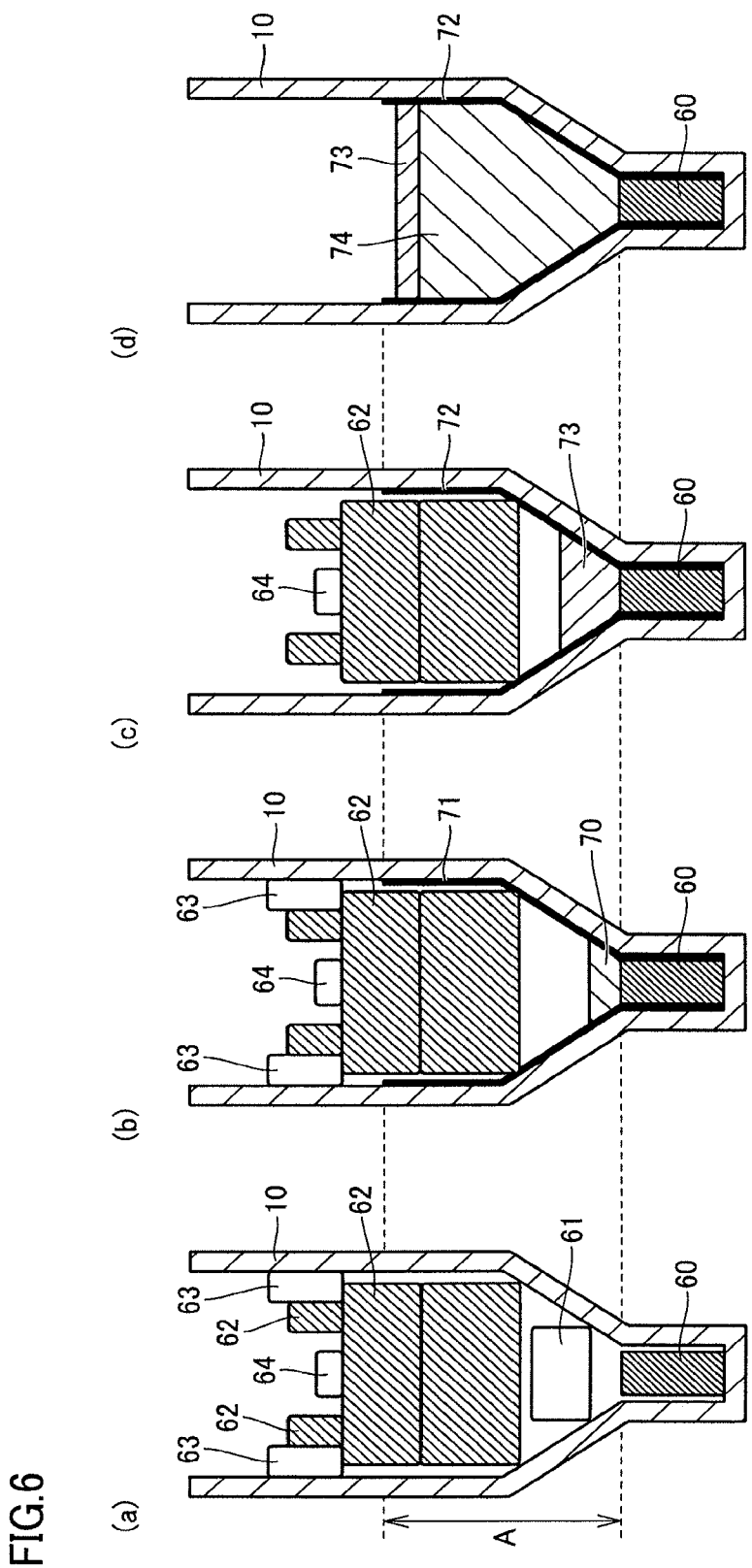
FIG. 6 represents a state in a growth container at each step in a production method according to Example 1.

First, GaAs single crystal 60 as the seed crystal, 100 g of $B_2O_3$ 61, 5000 g in total weight of polycrystalline GaAs 62, 100 g of $SiO_2$—$B_2O_3$ 63, and 1400 mg of Si 64 were placed in crucible 10, taking the arrangement shown in FIG. 6 (a). 2000 mg of As for adjusting the inner pressure was provided together with Si 64. The water content of $B_2O_3$ 61 was 60 ppm. $B_2O_3$ 61 had no impurities added, and its purity was greater than or equal to 99 atm %.

For polycrystalline GaAs 62, cylindrical polycrystalline GaAs arranged in the proximity of $B_2O_3$ 61, and ring-shaped polycrystalline GaAs arranged above cylindrical polycrystalline GaAs were employed. For $SiO_2$—$B_2O_3$ 63, $B_2O_3$ doped with 12 mol % of $SiO_2$ was employed.

After each of the substances set forth above was placed in crucible 10 to attain the arrangement shown in FIG. 6 (a), crucible 10 was placed in a quartz ampoule that is receptacle 12 of ampoule 11. Then, the interior of a quartz ampoule was evacuated, and a quartz cap identified as lid 13 was fitted. Crucible 10 was vacuum-sealed in ampoule 11.

Ampoule 11 was heated by heater 16 such that region A of FIG. 6 (a) became 600° C. to melt $B_2O_3$ 61. Thus, $B_2O_3$ melt 70 was arranged in crucible 10. Region A was maintained at the temperature of 600° C. for one hour, whereby a $B_2O_3$ film 71 was formed at the region in crucible 10 corresponding to region A, as shown in FIG. 6 (b). In the present step, the temperature at the region where $SiO_2$—$B_2O_3$ 63 was arranged was maintained at 300° C. to prevent excessive rise of the temperature at that region while region A was heated at 600° C.

2. Silicon Oxide-Boron Oxide Film Formation Step

Then, ampoule 11 was heated by heater 16 such that the entirety of crucible 10 became 600° C. to melt $SiO_2$—$B_2O_3$ 63. As shown in FIG. 6 (c), $SiO_2$—$B_2O_3$ melt 73 was arranged in crucible 10. This $SiO_2$—$B_2O_3$ melt 73 is a mixture of $B_2O_3$ melt 70 and $SiO_2$—$B_2O_3$ 63 melt. The entirety of crucible 10 was maintained at the temperature of 600° C. for 3 hours to cause formation of $SiO_2$—$B_2O_3$ film 72 in crucible 10.

3. Raw Material Melt Formation Step

Heater 16 heated ampoule 11 such that to the entirety of crucible 10 excluding the region where GaAs single crystal 60 was arranged became 1240° C. to melt polycrystalline GaAs 62. As shown in FIG. 6 (d), GaAs melt 74 with Si mixed (hereinafter, referred to as "Si—GaAs melt") was arranged in crucible 10.

4. Semiconductor Single Crystal Growth Step

Figure 7:
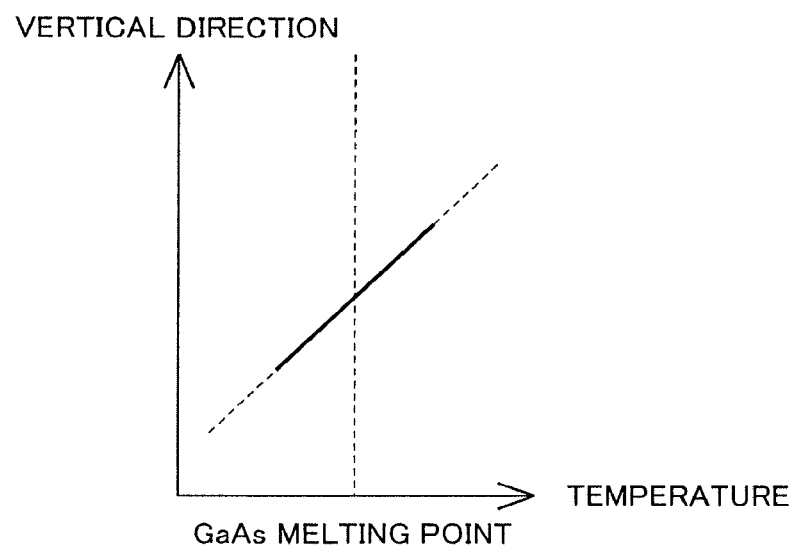
FIG. 7 schematically represents a temperature gradient applied to the growth container.

Following the seeding of GaAs single crystal 60 relative to Si—GaAs melt 74, the temperature gradient shown in FIG. 7 was applied to ampoule 11 in the vertical direction under control of heater 16. In FIG. 7, the vertical axis represents the vertical direction of ampoule 11, whereas the horizontal axis represents the temperature. The region where the temperature is lower than or equal to the melting point of GaAs in FIG. 7 corresponds to the region where GaAs single crystal 60 shown in FIG. 6 (d) is arranged.

By lowering shaft 15 at the rate of 5 mm/h, ampoule 11 was moved downwards at the rate of 5 mm/h with respect to the temperature gradient of FIG. 7. In accordance with this movement, the temperature applied to Si—GaAs melt 74 was reduced at the rate of 20° C./cm from the side of GaAs single crystal 60. Accordingly, Si—GaAs melt 74 was solidified from the side of GaAs single crystal to grow a Si—GaAs single crystal.

The grown Si—GaAs single crystal was taken out from crucible 10. With regard to a cylindrical portion having a diameter of 105 mm and a length of 100 mm from the Si—GaAs single crystal taken out, the surface and the aspect of the interior of the crystal exposed when the crystal was sliced in rounds at equal interval were observed. At the surface and interior of the Si—GaAs single crystal, twinning and polycrystallization were not observed. Precipitation of boron arsenic at the surface of the crystal was observed at 6 sites.

Example 2

A Si—GaAs single crystal was grown by a method similar to that of Example 1, except that GaAs doped with $4 \times 10^{-5}$ mol % of Si was employed as polycrystalline GaAs 62. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 7 sites.

Example 3

A Si—GaAs single crystal was grown by a method similar to that of Example 1, except that the heating temperature of the entirety of crucible 10 was 900° C. in the silicon oxide-boron oxide film formation step. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was not observed.

Example 4

A Si—GaAs single crystal was grown by a method similar to that of Example 1, except that the heating temperature of the entirety of crucible 10 was 200° C. in the silicon oxide-boron oxide film formation step. The aspect of the crystal in the grown Si—GaAs single crystal was observed in a manner similar to that of Example 1. Twinning and polycrystallization were not observed at the surface and interior of the Si—GaAs single crystal. Furtheiuiore, precipitation of boron arsenic at the surface of the crystal was not observed.

Example 5

A Si—GaAs single crystal was grown by a method similar to that of Example 1, except for employing, as $SiO_2$—$B_2O_3$ 63, 100 g of $B_2O_3$ doped with 1 mol % of $SiO_2$. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 12 sites.

Example 6

A Si—GaAs single crystal was grown by a method similar to that of Example 5, except that the heating temperature of the entirety of crucible 10 was 900° C. in the silicon oxide-boron oxide film formation step. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 3 sites.

Example 7

A Si—GaAs single crystal was grown by a method similar to that of Example 5, except that, in the silicon oxide-boron oxide film formation step, the entirety of crucible 10 was maintained at 600° C. for one hour after $SiO_2$—$B_2O_3$ melt 73 was arranged in crucible 10. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 16 sites.

Example 8

A Si—GaAs single crystal was grown by a method similar to that of Example 5, except that, in the silicon oxide-boron oxide film formation step, the entirety of crucible 10 was maintained at 600° C. for 5 hours after $SiO_2$—$B_2O_3$ melt 73 was arranged in crucible 10. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 5 sites.

Example 9

A Si—GaAs single crystal was grown by a method similar to that of Example 7, except that crucible 10 was rotated at 10 rpm in the silicon oxide-boron oxide film formation step. The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was not observed.

Example 10

Using production equipment 100 of FIG. 1, Si—GaAs single crystal was produced by a production method set forth below. For crucible 10, a PBN-made crucible with an inner diameter of 105 mm (4 inches) was employed. For ampoule 11, a quartz-made ampoule was employed. For the sake of understanding, the present example will be described hereinafter with reference to FIG. 8.

<<Production Method>>

1. Boron Oxide Film Formation Step

On the inner wall of empty crucible 10 prior to the arrangement of various substances such as GaAs single crystal 60, a solution having orthoboric acid dissolved in methyl alcohol to attain saturation concentration was sprayed using an atomizer. Dry nitrogen gas flow was directed towards the inner wall of crucible 10 having the solution applied by spraying to facilitate the drying of methyl alcohol. This spraying and drying operation was repeated to form an orthoboric acid film of approximately 100 μm in thickness on the inner wall of crucible 10.

Figure 8:
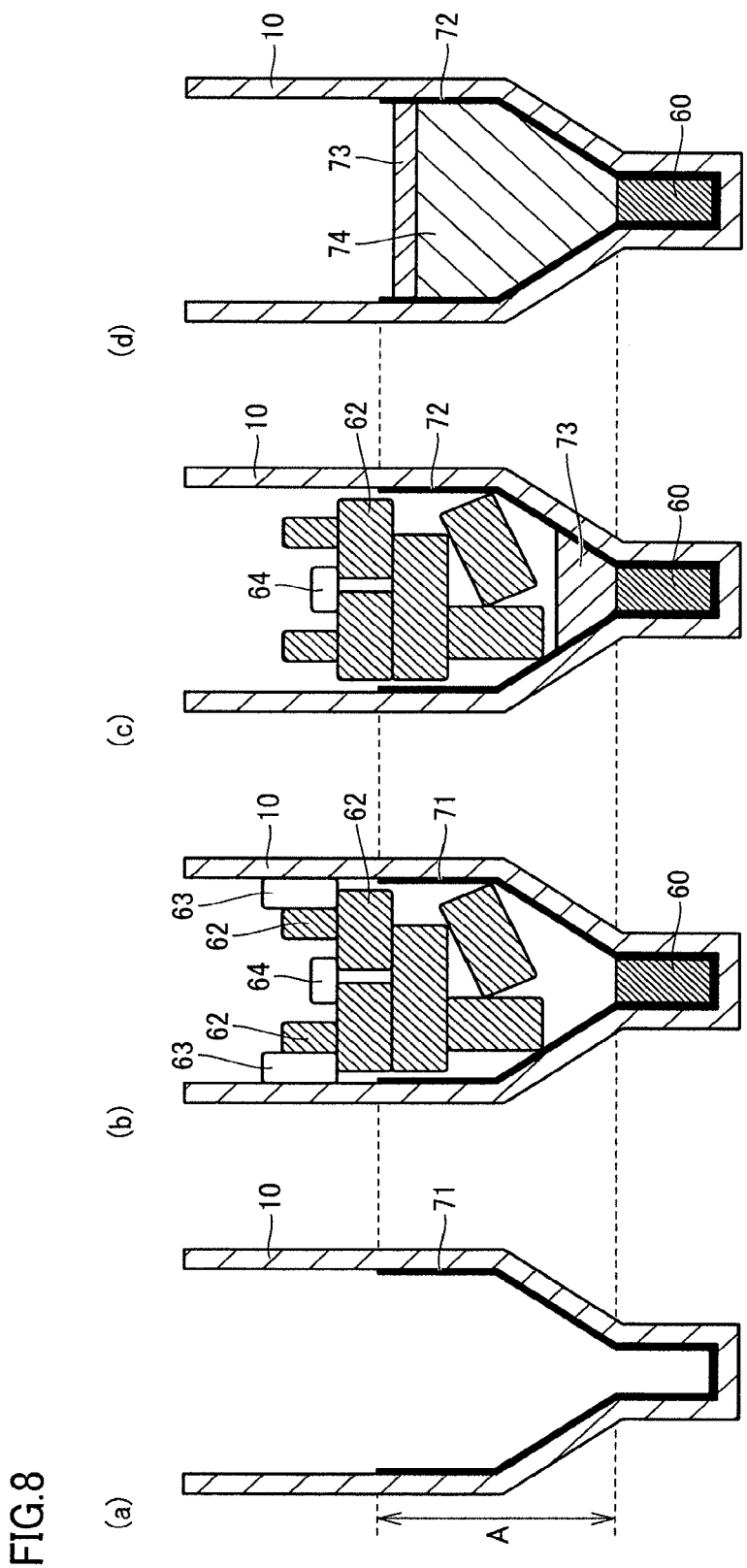
FIG. 8 represents a state in a growth container at each step in a production method according to Example 10.

Crucible 10 having an orthoboric acid formed was transferred to a furnace. Crucible 10 in the furnace was heated for two hours at 800° C. while nitrogen gas was introduced into the furnace at the rate of 1 l/min. As shown in FIG. 8 (a), a $B_2O_3$ film 71 having a thickness of approximately 50 μm was formed on the inner wall of crucible 10.

2. Silicon Oxide-Boron Oxide Film Formation Step

Then, crucible 10 having $B_2O_3$ film 71 formed was placed in ampoule 11. In crucible 10, GaAs single crystal 60 as the seed crystal, 5000 g in total weight of polycrystalline GaAs 62, 150 g of $SiO_2$—$B_2O_3$ 63, and 1400 mg of Si 64 were placed, taking the arrangement shown in FIG. 8 (b). 2000 mg of As for adjusting the inner pressure was provided together with Si 64. Likewise with Example 1, $B_2O_3$ doped with 12 mol % of $SiO_2$ was employed for $SiO_2$—$B_2O_3$ 63.

After each of the substances set forth above was placed in crucible 10 to attain the arrangement shown in FIG. 8 (b), crucible 10 was placed in a quartz ampoule that is receptacle 12 of ampoule 11. Then, the interior of the quartz ampoule was evacuated, and a quartz cap identified as lid 13 was fitted. Crucible 10 was vacuum-sealed in ampoule 11.

Then, ampoule 11 was heated by heater 16 such the entirety of crucible 10 became 600° C. to melt $SiO_2$—$B_2O_3$ 63. Thus, $SiO_2$—$B_2O_3$ melt 73 was arranged in crucible 10, as shown in FIG. 8 (c). The entirety of crucible 10 was maintained at the temperature of 600° C. for 3 hours, whereby $SiO_2$—$B_2O_3$ film 72 was formed in crucible 10.

Furthermore, by carrying out a step similar to the raw material melt formation step of Example 1, Si—GaAs melt 74 was produced, as shown in FIG. 8 (d). By carrying out a step similar to the semiconductor single crystal growth step of Example 1, a Si—GaAs single crystal was grown.

The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 8 sites.

Example 11

A Si—GaAs single crystal was grown according to a method similar to that of Example 10, except that production equipment 100 having a quartz crucible 10 was employed, and $B_2O_3$ film 71 was formed by vapor deposition in the boron oxide film formation step. Vapor deposition was carried out according to the procedure set forth below.

First, an empty crucible 10 was fixed in a vapor deposition equipment. Solid boron nitride was placed at a holder in the vapor deposition equipment. After the interior of the vapor deposition equipment was evacuated and sealed, an electron beam was directed to the boron nitride to form a boron nitride film on the inner wall of crucible 10. Then, crucible 10 having a boron nitride film formed was transferred to a furnace. Crucible 10 was heated for 10 hours at 1000° C. under an oxygen gas atmosphere to form a $B_2O_3$ film 71 having a thickness of approximately 50 μm on the inner wall of crucible 10.

The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 9 sites.

Example 12

A Si—GaAs single crystal was grown by a method similar to that of Example 10, except that the inner wall of PBN-made crucible 10 was subjected to oxidation to form $B_2O_3$ film 71 in the boron oxide film formation step. The oxidation was carried out according to the procedure set forth below.

First, PBN-made crucible 10 was placed in a furnace. In the furnace, crucible 10 was heated for 50 hours at 1100° C. while oxygen gas was introduced into crucible 10 at the rate of 1 l/min to form a $B_2O_3$ film 71 to a thickness of approximately 60 μm, on the inner wall of crucible 10.

The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 7 sites.

Example 13

Using production equipment 200 of FIG. 4, a Si—GaAs single crystal was produced by a production method set forth below. For crucible 10, a PBN-made crucible having an inner diameter of 105 mm (4 inches) was employed. A quartz-made reservoir 40 and a quartz-made support unit 41 were used. The outer diameter of enclosure section 41*a* of support unit 41 was 80 mm. For the sake of understanding, the present example will be described hereinafter with reference to FIG. 9.

<<Production Method>>

1. Boron Oxide Film Formation Step

Figure 9:
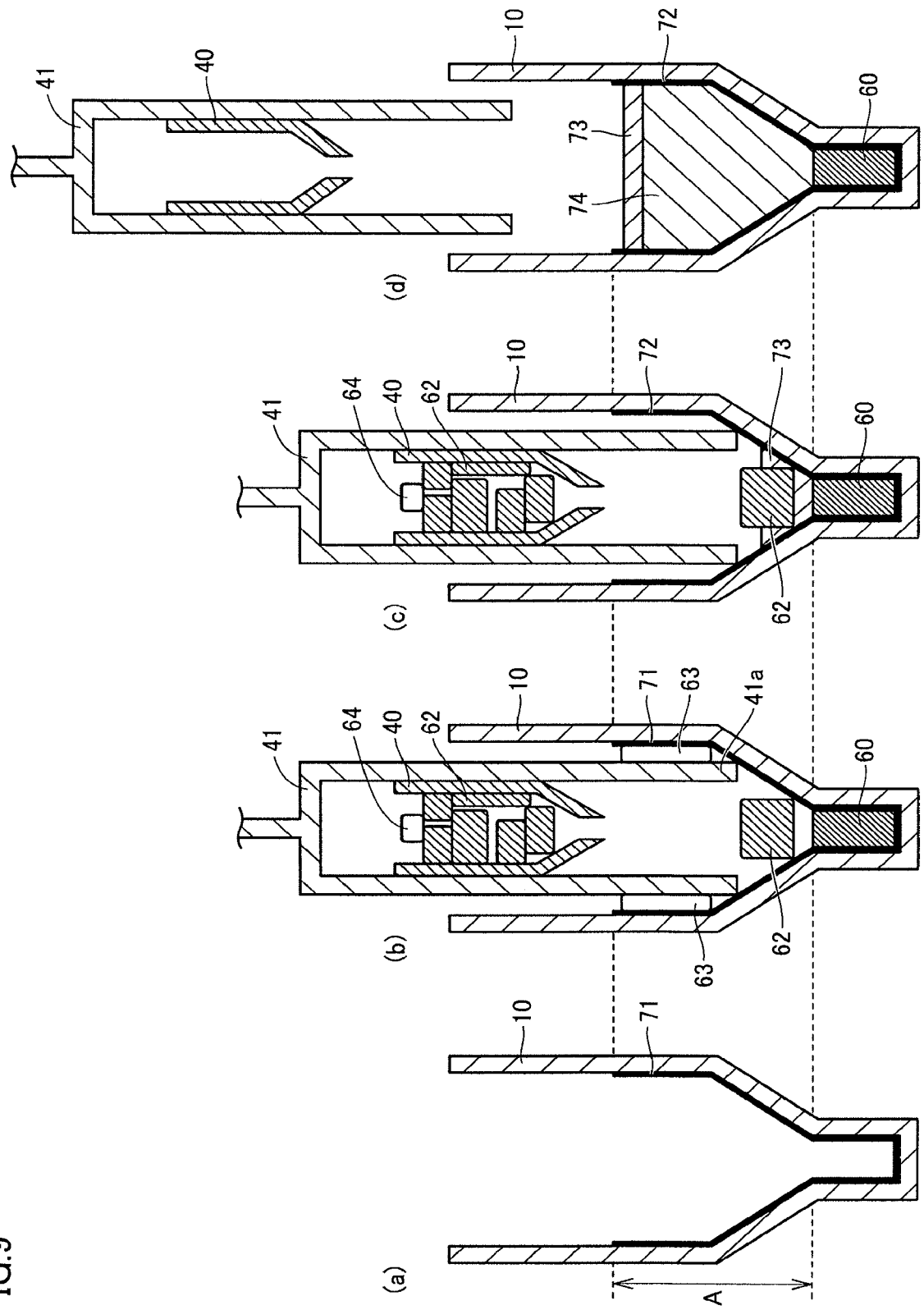
FIG. 9 represents a state in a growth container at each step in a production method according to Example 13.

By a method similar to that of Example 12, a $B_2O_3$ film 71 having a thickness of 60 μm was formed on the inner wall of crucible 10, as shown in FIG. 9 (*a*).

2. Silicon Oxide-Boron Oxide Film Formation Step

Then, crucible 10 having $B_2O_3$ film 71 formed was mounted on crucible mount 14. GaAs single crystal 60 that is the seed crystal was placed at the bottom section of crucible 10, and 500 g of polycrystalline GaAs 62 was arranged in the neighborhood above, taking the arrangement shown in FIG. 9 (*b*). In reservoir 40, 4500 g in total weight of polycrystalline GaAs 62 of arbitrary shape was placed. Above polycrystalline GaAs 62, 1400 mg of Si 64 was arranged. Furthermore, 2000 mg of As for adjusting the inner pressure was arranged together with Si 64.

Reservoir 40 in which the substances set forth above were stored was encased in support unit 41. Support unit 41 was inserted into crucible 10 in which GaAs single crystal 60 was stored. Furthermore, 150 g of $SiO_2$—$B_2O_3$ 63 was arranged at the gap between support unit 41 and the inner wall of crucible 10. For $SiO_2$—$B_2O_3$, $B_2O_3$ doped with 12 mol % of $SiO_2$ was used, formed by heating subsequent to the coexistence of $H_3BO_3$ powder and $SiO_2$ powder, likewise with Example 1.

Then, by heating crucible 10 through heater 16 such that region A of FIG. 9 (*b*) became 600° C. to melt $SiO_2$—$B_2O_3$ 63, $SiO_2$—$B_2O_3$ melt 73 was arranged in crucible 10, as shown in FIG. 9 (*c*). Then, the entirety of crucible 10 was maintained at the temperature of 600° C. for 3 hours to form $SiO_2$—$B_2O_3$ film 72 in crucible 10.

3. Raw Material Melt Formation Step

Then, the entirety of crucible 10 excluding the region where GaAs single crystal 60 was arranged and the entirety of reservoir 40 were heated by heater 16 to attain the temperature of 1240° C., whereby polycrystalline GaAs 62 in crucible 10 was melted, and polycrystalline GaAs 62 in reservoir 40 was melted, resulting in the fall of droplets together with Si 64 down into crucible 10 located below reservoir 40. Thus, Si—GaAs melt 74 was arranged above GaAs single crystal 60 in crucible 10 by all the melt falling down in droplets.

4. Semiconductor Single Crystal Growth Step

As shown in FIG. 9 (*d*), support unit 41 was elevated such that the lower end thereof was not located in region A where a semiconductor single crystal is to be to grown. Then, a Si—GaAs single crystal was grown according to a method similar to the semiconductor single crystal growth method of Example 1.

The aspect of the crystal in the grown Si—GaAs single crystal was observed in a manner similar to that of Example 1. Twinning and polycrystallization were not observed at the surface and interior of the Si—GaAs single crystal. Furthermore, precipitation of boron arsenic at the surface of the crystal was observed at 6 sites.

Comparative Example 1

Using a production equipment similar to that of Example 1, a Si—GaAs single crystal was produced by the method set forth below.

Figure 10:
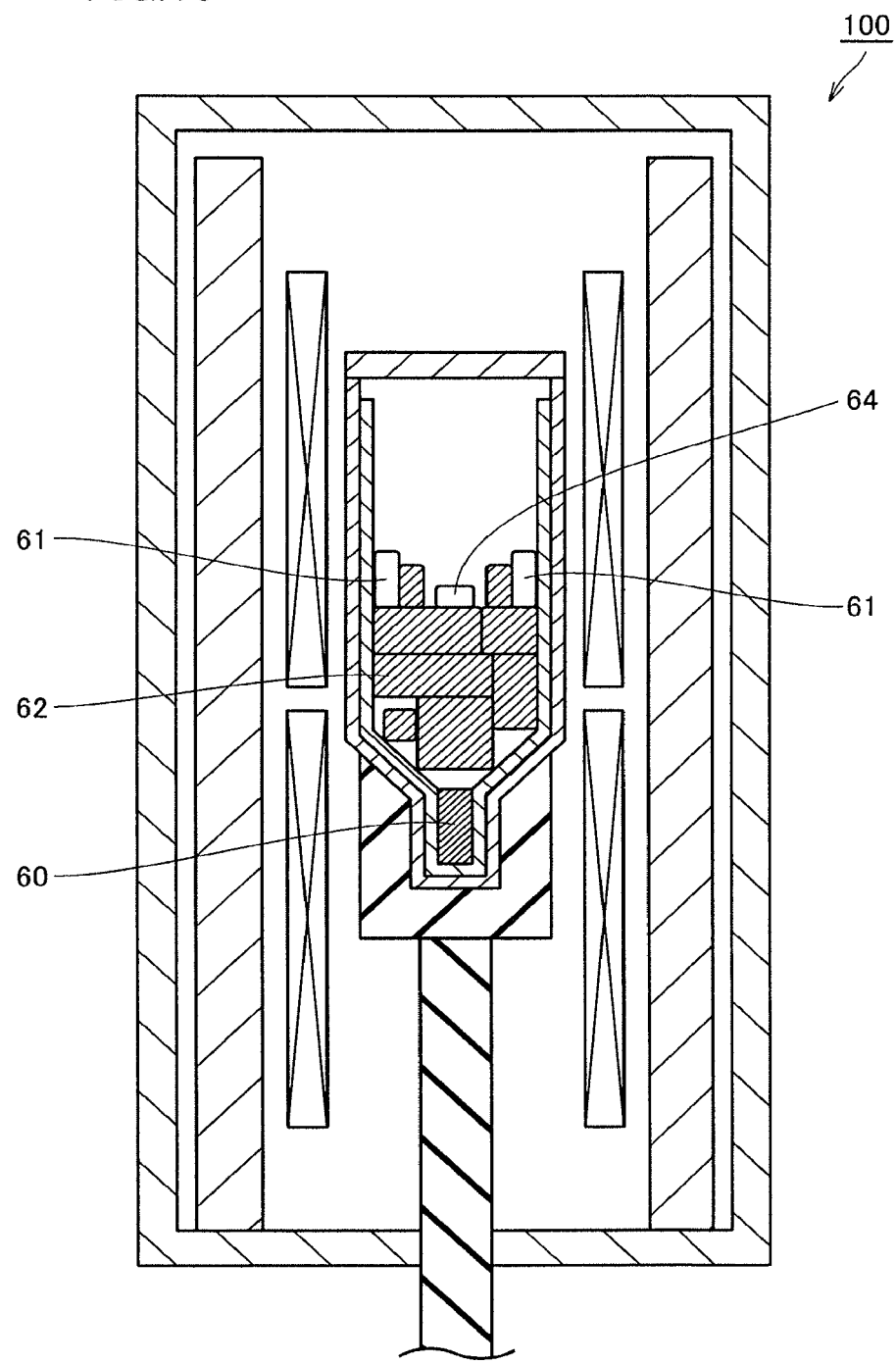
FIG. 10 is a diagram to describe a method of producing a semiconductor single crystal according to Comparative Example 1.

First, GaAs single crystal 60 as the seed crystal, 150 g of $B_2O_3$ 61, 5000 g of polycrystalline GaAs 62, and 1400 mg of Si 64 were placed in crucible 10, taking the arrangement shown in FIG. 10. 2000 mg of As for adjusting the inner pressure was provided together with Si 64. The water content of $B_2O_3$ 61 was 40 ppm. $B_2O_3$ 61 had no impurities added, and its purity was greater than or equal to 99 atm %.

After each of the substances set forth above was placed in crucible 10 to attain the arrangement shown in FIG. 10, crucible 10 was placed in a quartz ampoule that is receptacle 12 of ampoule 11. Then, the interior of a quartz ampoule was evacuated, and a quartz cap identified as lid 13 was fitted. Thus, crucible 10 was vacuum-sealed in ampoule 11.

Then, heater 16 heated ampoule 11 such that to the entirety of crucible 10 excluding the region where GaAs single crystal 60 was arranged became 1240° C. to melt polycrystalline GaAs 62. Si—GaAs melt 74 was arranged above GaAs single crystal 60. A Si—GaAs single crystal was grown in a manner similar to the semiconductor single crystal growth step of Example 1.

The aspect of the crystal in the grown Si—GaAs single crystal was observed in a manner similar to that of Example 1. Twinning was observed at the surface and interior of the Si—GaAs single crystal. Furthermore, precipitation of boron arsenic at the position of twinning and the surface of the crystal was observed at 82 sites.

Comparative Example 2

Figure 11:
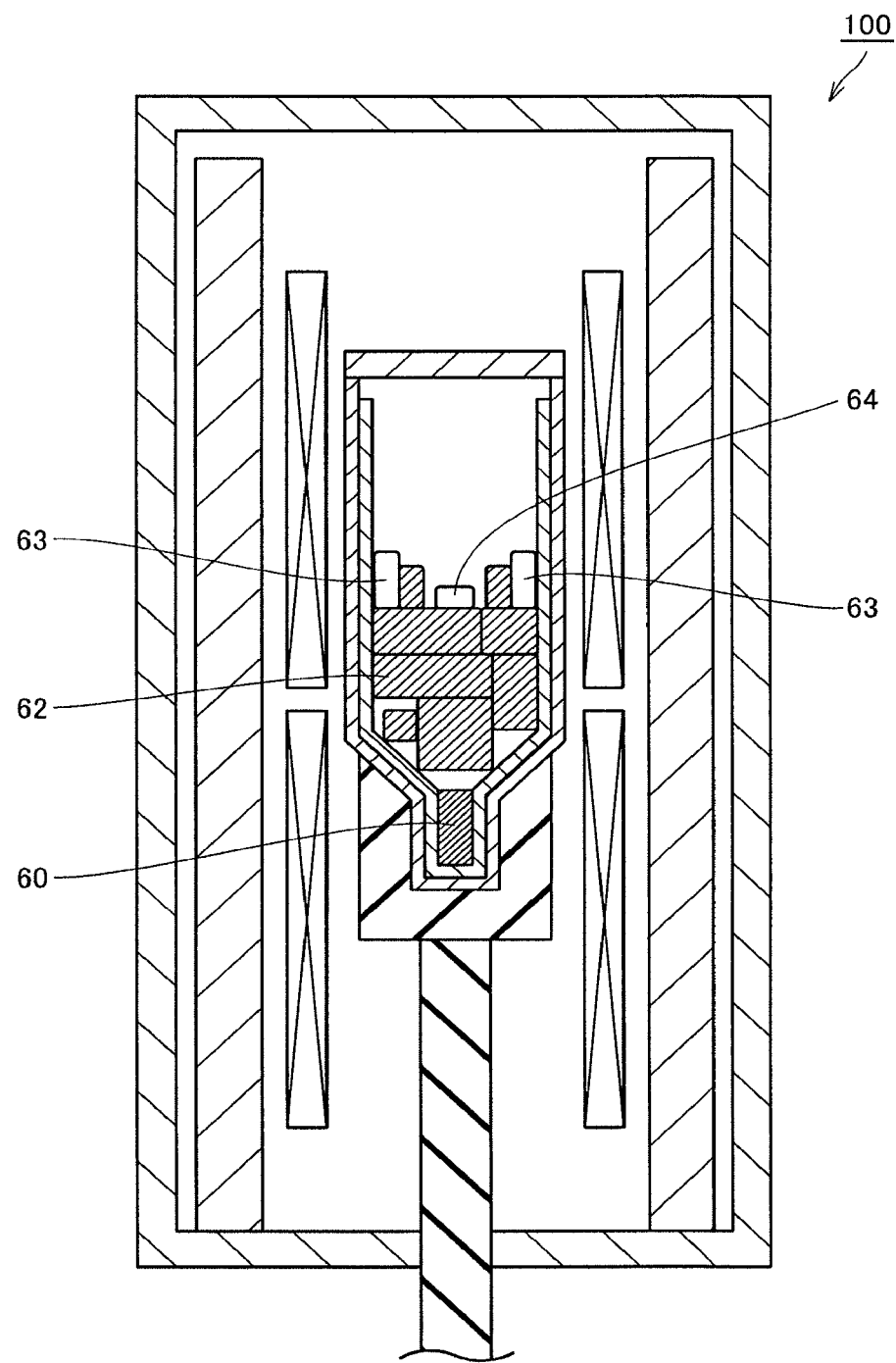
FIG. 11 is a diagram to describe a method of producing a semiconductor single crystal according to Comparative Example 2 and Comparative Example 3.

A Si—GaAs single crystal was grown in a manner similar to that of Example 1, except that, as shown in FIG. 11, $B_2O_3$ 61 was not disposed in crucible 10, 150 g of $B_2O_3$ having 12 mol % of $SiO_2$ doped was arranged as $SiO_2$—$B_2O_3$ 63, a boron oxide film formation step was not carried out, and the entirety of crucible 10 was maintained at the temperature of 600° C. for one hour in the silicon oxide-boron oxide film formation step.

The aspect of the crystal in the grown Si—GaAs single crystal was observed in a manner similar to that of Example 1. Twinning was observed at the surface and interior of the Si—GaAs single crystal. Furthermore, precipitation of boron arsenic at the position of twinning and the surface of the crystal was observed at 26 sites.

Comparative Example 3

A Si—GaAs single crystal was grown in a manner similar to that of Comparative Example 2, except that, as shown in FIG. 11, $B_2O_3$ doped with 15 mol % of $SiO_2$ was employed as $SiO_2$—$B_2O_3$ 63, and the entirety of crucible 10 was maintained at the temperature of 600° C. for one hour in the silicon oxide-boron oxide film formation step.

The aspect of the crystal in the grown Si—GaAs single crystal was observed in a manner similar to that of Example 1. Twinning was observed at the surface and interior of the Si—GaAs single crystal. Furthermore, precipitation of boron arsenic at the position of twinning and the surface of the crystal was observed at 24 sites.

To facilitate the comparison of Examples 1-13 and Comparative Examples 1-3 set forth above, the difference in the substances employed in each example and each comparative example is summarized in Table 1. The difference in the step carried out at each example and each comparative example as well as the manner of the crystal in the Si—GaAs single crystal are summarized in Table 2.

Moreover, it was found from the results of Examples 5-9 that, in the case where $SiO_2$—$B_2O_3$ having 1 mol % of $SiO_2$ doped was employed, a Si—GaAs single crystal with no crystal defect can be produced by heating at 600° C. for one hour in the silicon oxide-boron oxide film formation step. However, upon comparison between Example 1 and Example 5, it was found that precipitation of boron arsenic

TABLE 1

| | $B_2O_3$ | $SiO_2$—$B_2O_3$ | | Polycrystalline GaAs | | |
|---|---|---|---|---|---|---|
| | Total Weight (g) | Total Weight (g) | $SiO_2$ Concentration (mol %) | Total Weight (g) | Si Concentration (mol %) | Crucible Material |
| Example 1 | 100 | 100 | 12 | 5000 | — | PBN |
| Example 2 | 100 | 100 | 12 | 5000 | $4 \times 10^{-5}$ | PBN |
| Example 3 | 100 | 100 | 12 | 5000 | — | PBN |
| Example 4 | 100 | 100 | 12 | 5000 | — | PBN |
| Example 5 | 100 | 100 | 1 | 5000 | — | PBN |
| Example 6 | 100 | 100 | 1 | 5000 | — | PBN |
| Example 7 | 100 | 100 | 1 | 5000 | — | PBN |
| Example 8 | 100 | 100 | 1 | 5000 | — | PBN |
| Example 9 | 100 | 100 | 1 | 5000 | — | PBN |
| Example 10 | — | 150 | 12 | 5000 | — | PBN |
| Example 11 | — | 150 | 12 | 5000 | — | Quartz |
| Example 12 | — | 150 | 12 | 5000 | — | PBN |
| Example 13 | — | 150 | 12 | 5000 | — | PBN |
| Comparative Example 1 | 150 | — | — | 5000 | — | PBN |
| Comparative Example 2 | — | 150 | 12 | 5000 | — | PBN |
| Comparative Example 3 | — | 150 | 15 | 5000 | — | PBN |

TABLE 2

| | | | Manner of Si—GaAs Single Crystal | |
|---|---|---|---|---|
| | $B_2O_3$ Film Formation Step | $SiO_2$—$B_2O_3$ Film Formation Step | Crystal Defect | Precipitation of Boron Arsenic |
| Example 1 | Heating at 600° C. for 1 hour | Heating at 600° C. for 3 hours | none | 6 sites |
| Example 2 | Heating at 600° C. for 1 hour | Heating at 600° C. for 3 hours | none | 7 sites |
| Example 3 | Heating at 600° C. for 1 hour | Heating at 900° C. for 3 hours | none | 0 site |
| Example 4 | Heating at 600° C. for 1 hour | Heating at 1200° C. for 3 hours | none | 0 site |
| Example 5 | Heating at 600° C. for 1 hour | Heating at 600° C. for 3 hours | none | 12 sites |
| Example 6 | Heating at 600° C. for 1 hour | Heating at 900° C. for 3 hours | none | 3 sites |
| Example 7 | Heating at 600° C. for 1 hour | Heating at 600° C. for 1 hour | none | 16 sites |
| Example 8 | Heating at 600° C. for 1 hour | Heating at 600° C. for 5 hours | none | 5 sites |
| Example 9 | Heating at 600° C. for 1 hour | Heating at 600° C. for 5 hours + rotation | none | 0 site |
| Example 10 | Spray | Heating at 600° C. for 3 hours | none | 8 sites |
| Example 11 | Vapor Deposition | Heating at 600° C. for 3 hours | none | 9 sites |
| Example 12 | Oxidation | Heating at 600° C. for 3 hours | none | 7 sites |
| Example 13 | Oxidation | Heating at 600° C. for 3 hours | none | 6 sites |
| Comparative Example 1 | — | — | Twin crystal present | 82 sites |
| Comparative Example 2 | — | Heating at 600° C. for 1 hour | Twin crystal present | 26 sites |
| Comparative Example 3 | — | Heating at 600° C. for 3 hours | Twin crystal present | 24 sites |

It is found from the results of Example 1 that when $SiO_2$—$B_2O_3$ having 12 mol % of $SiO_2$ doped is employed, a Si—GaAs single crystal can be produced with no crystal defect by heating at 600° C. for 3 hours in the silicon oxide-boron oxide film formation step. It was also found from the results of Examples 1-4 that a higher heating temperature without exceeding the melting point of GaAs is advantageous in that, not only the generation of crystal defect is suppressed, but also precipitation of boron arsenic was suppressed.

is increased when the $SiO_2$ concentration of $SiO_2$—$B_2O_3$ is low. By the comparison of Examples 5-9, it was found that precipitation of boron arsenic could be overcome by increasing the heating temperature in the silicon oxide-boron oxide film formation step, increasing the heating duration, or by heating while the crucible is rotated.

It was also found from the results of Examples 10-13 that a Si—GaAs single crystal with no crystal defect can be produced when a $B_2O_3$ film was formed in advance at the crucible.

In contrast to Examples 1-13, Comparative Example 1 demonstrated the occurrence of twinning at the produced Si—GaAs single crystal. This is probably due to the fact that a $SiO_2$—$B_2O_3$ film was not formed on the inner wall of the crucible. Furthermore, although twinning occurred at the single crystal Si—GaAs produced in Comparative Examples 2 and 3, this is probably due to the fact that a film cannot be readily formed evenly on the inner wall of the crucible only by $SiO_2$—$B_2O_3$ melt having high melt viscosity.

Although the invention has been described based on embodiments and examples in the preferred form, it is intended that the features of the embodiments and examples may be combined appropriately. Furthermore, it should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

Since a semiconductor single crystal with no defect can be produced according to the present invention, the present invention is suitable for the production of a substrate applied to a light emitting diode (LED) and laser diode (LD).

REFERENCE SIGNS LIST

10 crucible; 11 ampoule; 12 receptacle; 13 lid; 14 crucible mount; 15 shaft; 16 heater; 17 heat insulator; 18 airtight chamber; 20 seed crystal; 21 boron oxide; 22, 25 compound raw material; 23 boron oxide containing silicon oxide; 24 dopant; 30 boron oxide melt; 31 boron oxide film; 32 silicon oxide-boron oxide film; 33 silicon oxide-boron oxide melt; 34 raw material melt; 40 reservoir; 41 support unit; 41*a* enclosure section; 41*b* support section.

The invention claimed is:

1. A growth container comprising:
    a bottom section;
    a body section continuous to the bottom section; and
    a boron oxide film formed on an inner wall of the bottom section and the body section,
    the boron oxide film containing a silicon dioxide,
    a concentration of the silicon dioxide in the boron oxide film being greater than or equal to 1 mol % and less than or equal to 12 mol %, and
    the silicon dioxide being evenly distributed in a thickness direction of the boron oxide film, wherein
    the bottom section and the body section are made of boron nitride, pyrolytic boron nitride, pyrolytic graphite, graphite, glassy carbon, silicon carbide, alumina, zirconia, silicon nitride, or quartz.

2. The growth container according to claim 1, wherein the silicon dioxide is evenly distributed throughout the entirety of the boron oxide film.

3. The growth container according to claim 1, wherein the boron oxide film consists of a single layer.

* * * * *